US009362924B1

(12) United States Patent
Xu et al.

(10) Patent No.: US 9,362,924 B1
(45) Date of Patent: Jun. 7, 2016

(54) METHOD AND APPARATUS FOR FAST FREQUENCY ACQUISITION IN PLL SYSTEM

(71) Applicant: Integrated Device Technology, Inc., San Jose, CA (US)

(72) Inventors: Changxi Xu, San Jose, CA (US); Hui Li, Fremont, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 14/794,770

(22) Filed: Jul. 8, 2015

(51) Int. Cl.
*H03L 7/06* (2006.01)
*H03L 7/085* (2006.01)
*G04F 10/00* (2006.01)
*H03L 7/099* (2006.01)

(52) U.S. Cl.
CPC .............. *H03L 7/085* (2013.01); *G04F 10/005* (2013.01); *H03L 7/0992* (2013.01)

(58) Field of Classification Search
USPC .................................. 327/147–149, 156–158
See application file for complete search history.

(56) References Cited

U.S. PATENT DOCUMENTS

| 8,704,564 B2 * | 4/2014 | Hasegawa | H03L 7/093 327/147 |
| 2013/0211758 A1 * | 8/2013 | Prathapan | H03L 7/08 702/66 |
| 2014/0210532 A1 * | 7/2014 | Jenkins | H03L 7/087 327/159 |
| 2014/0347941 A1 * | 11/2014 | Jose | G11C 7/222 365/191 |

OTHER PUBLICATIONS

In-Chul Hwang et al. "A Digitally Controlled Phase-Locked Loop With a Digital Phase-Frequency Detector for Fast Acquisition," IEEE Journal of Solid-State Circuits, vol. 36, No. 10, Oct. 2001, pp. 1574-1581.

Takamoto Watanabe and Shigenori Yamauchi "An All-Digital PLL for Frequency Multiplication by 4 to 1022 With Seven-Cycle Lock Time," IEEE Journal of Solid-State Circuits, vol. 38, No. 2, Feb. 2003, pp. 198-204.

V. Kratyuk et al. "Frequency detector for fast frequency lock of digital PLLs," Electronics Letters Jan. 4, 2007 vol. 43 No. 1, pp.

Mozhgan Mansuri et al. "Fast Frequency Acquisition Phase-Frequency Detectors for GSamples/s Phase-Locked Loops," IEEE Journal of Solid-State Circuits, vol. 37, No. 10, Oct. 2002, pp. 1331-1334.

\* cited by examiner

*Primary Examiner* — Adam Houston
(74) *Attorney, Agent, or Firm* — Glass & Associates; Kenneth Glass

(57) ABSTRACT

A Method and Apparatus for Fast Frequency Acquisition in PLL System has been disclosed. In one implementation a time to digital converter is used with cycle slip detection for fast acquisition and lock. In one implementation cycle slip detection is applied to determine if a feedback clock from an oscillator is faster than a reference clock or not in one measurement cycle.

20 Claims, 23 Drawing Sheets

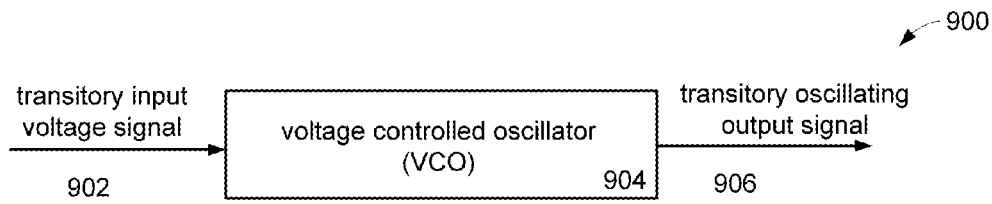
FIG. 9
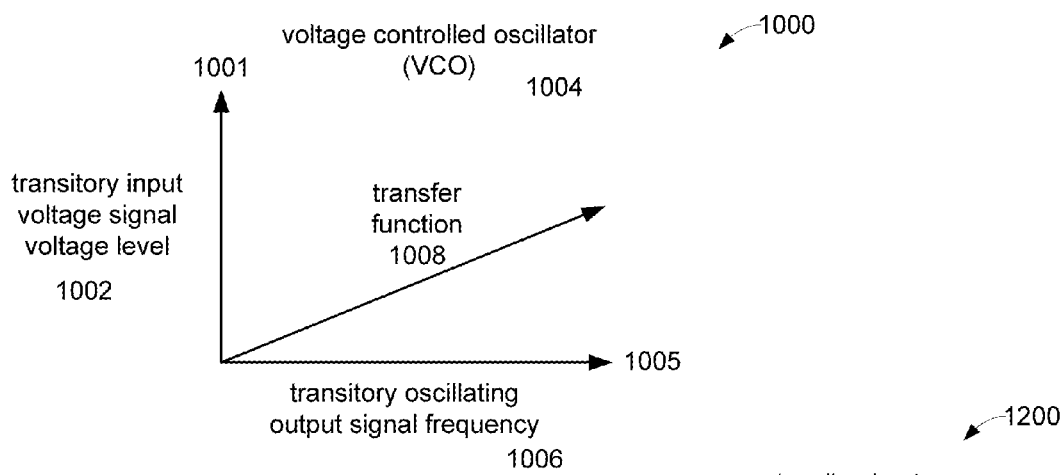
FIG. 10
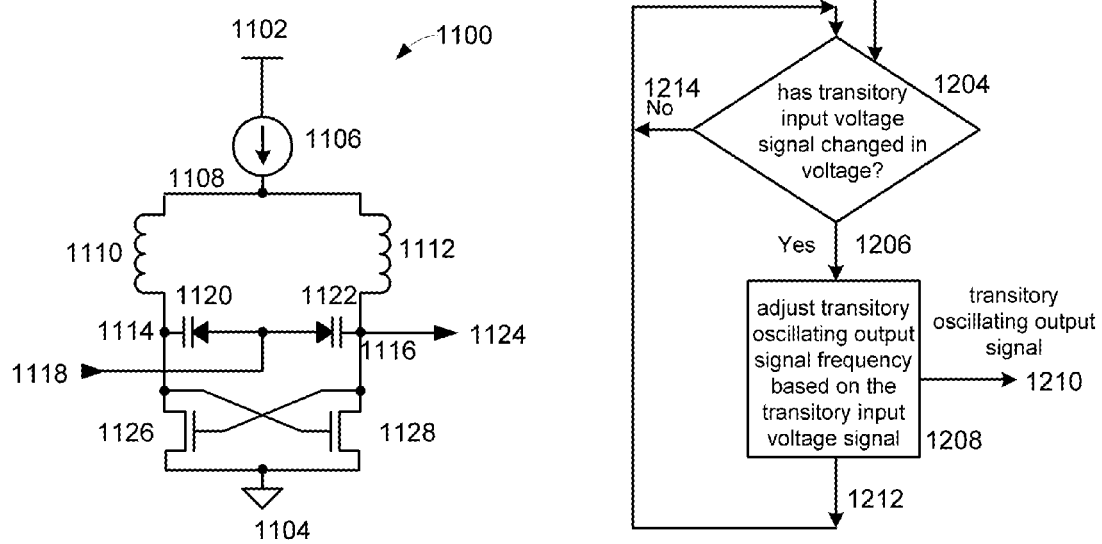
FIG. 11
FIG. 12

METHOD AND APPARATUS FOR FAST FREQUENCY ACQUISITION IN PLL SYSTEM

FIELD OF THE INVENTION

The present invention pertains to a PLL (Phase Locked Loop). More particularly, the present invention relates to a Method and Apparatus for Fast Frequency Acquisition in PLL System.

BACKGROUND OF THE INVENTION

In a PLL system the loop begins with frequency acquisition before it enters phase acquisition stage. The frequency acquisition process can take a long time if the initial frequency is far from the target frequency or the PLL has a very low loop bandwidth. In some locked time sensitive applications, a frequency acquisition loop is required to speed-up the loop locking time.

This presents a technical problem for which a technical solution using a technical means is needed.

SUMMARY

In one embodiment a method for fast acquisition and lock of a PLL (phase locked loop) is disclosed which uses a TDC (time to digital converter) to measure a phase difference between a feedback clock and a reference clock in the PLL and uses a cycle slip detection logic to determine a relationship between the feedback clock and the reference clock in the PLL.

In one embodiment an apparatus for generating a frequency control word (FCW) signal uses a reference clock signal, a feedback clock signal, a phase frequency detector (PFD) having a first input coupled to receive the reference clock signal, a second input coupled to receive the feedback clock signal, and it generates an up output signal and a down output signal, there is a first function block having a cycle slip detection unit, a start/stop logic unit, and an arbitration logic unit, the first function block having a first input coupled to receive the up output signal, a second input coupled to receive the down output signal, and it generates a cycle slip detection up output signal, a cycle slip detection down output signal, a start output signal, a stop output signal, and a polarity output signal, there is a time to digital converter (TDC) having a first input coupled to receive the start output signal, a second input coupled to receive the stop output, and it generates a TDC output signal, and there is a second function block having a finite state machine and a successive approximation unit, the second function block having a first input coupled to receive the cycle slip detection up output signal, a second input coupled to receive the cycle slip detection down output signal, a third input coupled to receive the TDC output signal, and a fourth input coupled to receive the polarity output signal, and it generates the FCW signal.

By using the techniques disclosed it is possible to achieve fast frequency acquisition in a narrow bandwidth PLL system. It can also be applied to frequency calibration and feedback divider ratio control with improved convergence speed.

BRIEF DESCRIPTION OF THE DRAWINGS

The invention is illustrated by way of example and not limitation in the figures of the accompanying drawings.

FIG. 9 illustrates an embodiment of a VCO in block diagram form.

FIG. 10 illustrates an embodiment of a VCO showing a transfer function in graph form.

FIG. 11 illustrates an embodiment of a VCO.

FIG. 12 illustrates an embodiment of a VCO in flow chart form.

DETAILED DESCRIPTION

In one embodiment of the invention a TDC (Time to Digital Converter) is used to speed time to lock.

In one embodiment of the invention a time to digital converter tdc, also denoted as TDC, includes logic for determining the time between a received start signal and a received stop signal. In one embodiment a tdc generates an output signal to indicate the time between a received start signal and a received stop signal.

In one embodiment of the invention a binary search (sometimes called Successive Approximation) technique based method is used to achieve fast frequency acquisition in a narrow bandwidth PLL system.

In one embodiment the invention can be applied to frequency calibration and feedback divider ratio control with improved convergence speed.

In one embodiment of the invention a TDC and binary search technique (SA) is used to achieve fast frequency acquisition in a narrow bandwidth PLL system. It also can be applied to frequency calibration and feedback divider ratio control with improved convergence speed.

In one embodiment of the invention cycle slip detection is applied to determine if a feedback clock from a DCO (Digitally Controlled Oscillator) or a VCO (Voltage Controlled Oscillator) is faster than a reference clock or not in one measurement cycle.

In one embodiment of the invention when no cycle slip event is detected, a TDC is used to measure the phase difference between the feedback clock and a reference clock and a criterion is applied to determine if the clock is fast or slow.

In one embodiment of the invention a binary search technique is directly applied for the digital frequency control word (FCW—frequency control word) to approximate the target frequency.

In one embodiment of the invention there is no need to know accurately the VCO or DCO period, the technique disclosed will converge as long as there is a monotonic function between the digital frequency control word and the VCO or DCO output frequency. The TDC resolution and accuracy is a guarantee of correct operation.

In one embodiment of the invention cycle slip detection is used to determine a condition of fast or slow between a reference clock and the feedback clock.

In one embodiment of the invention a TDC and a related truth table is used to determine fast or slow between the reference clock and the feedback clock.

In one embodiment of the invention a binary search or successive approximation technique is applied to achieve fast convergence.

In one embodiment of the invention fast acquisition and lock is a feature for a PLL utilizing the techniques disclosed.

In one embodiment of the invention Fast Frequency Calibration/Acquisition/Search in a Frequency/Phase Lock Loop system is achieved utilizing the techniques disclosed.

Figure 1:
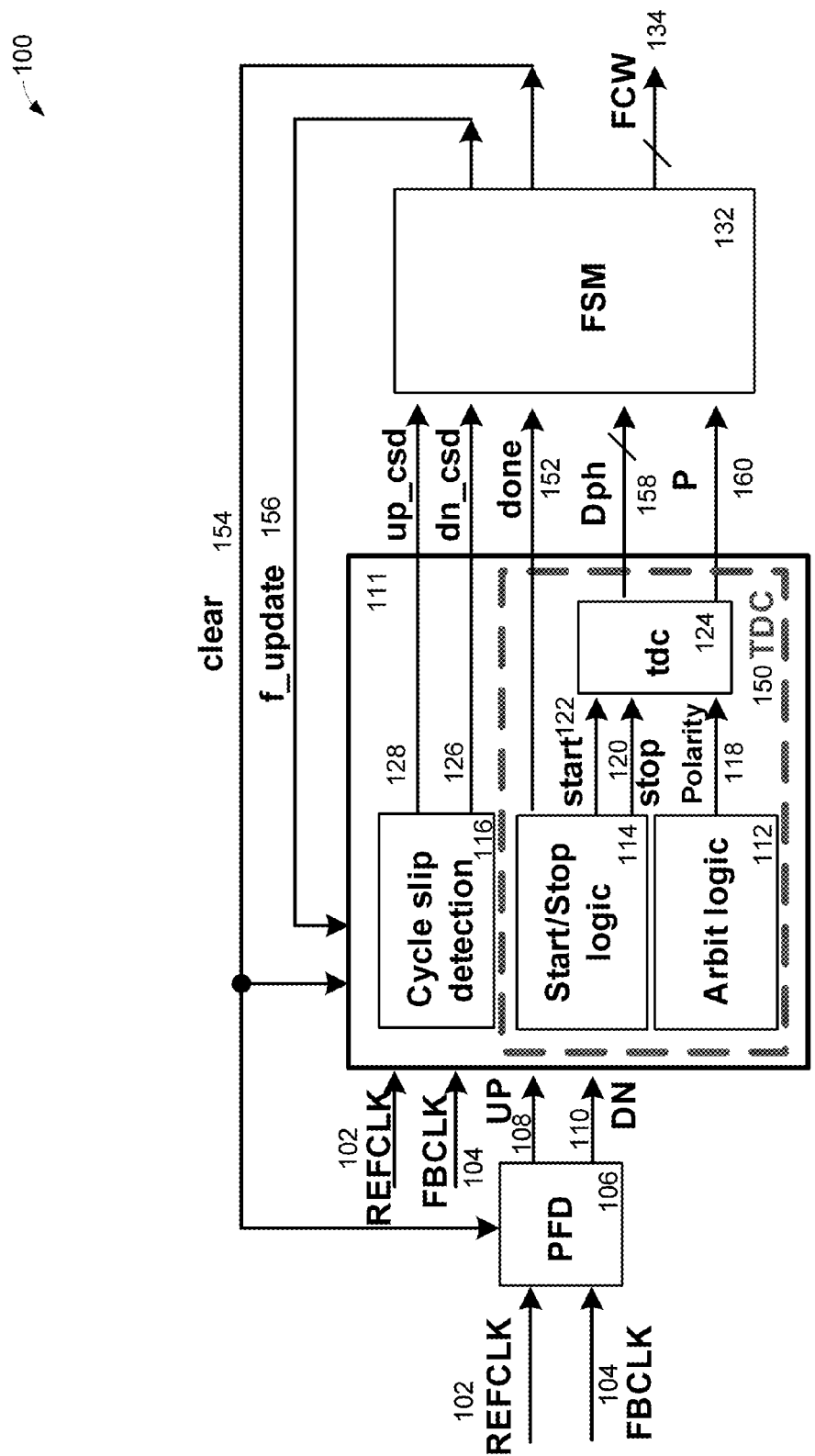
FIG. 1 illustrates one embodiment of the invention showing an architecture of a fast frequency acquisition/control unit.

FIG. 1 illustrates, generally at 100, one embodiment of the invention showing an architecture of a fast frequency acquisition/control unit. At 102 is a reference clock signal (REFCLK), at 104 is a feedback clock signal (FBCLK), at 106 is a phase frequency detector (PFD), at 108 an up signal (UP), at 110 a down signal (DN), at 111 a functional block having block contains two main functional units, 116 cycle slip detection logic (Cycle slip detection) and 150 a time to digital converter block (TDC). The TDC block 150 has several sub-blocks which includes at 112 arbitration logic (Arbit logic), at 114 start/stop logic (Start/Stop logic), and at 124 a time to digital converter (tdc). Functional block 111 receives signals REFCLK 102, FBCLK 104, and UP 108 and DN 110 signals generated by PFD 106 as well as clear 154 and f_update 156 which originate from FSM 132. 116 cycle slip detection logic (Cycle slip detection) generates as outputs a down signal (dn_csd) 126 and an up signal (up_csd) 128. Within TDC 150 at 112 is arbitration logic (Arbit logic) which generates as an output a Polarity signal 118, at 114 start/stop logic (Start/Stop logic) which generates as outputs a start signal (start) 122 and a stop signal (stop) 120. Functional unit 111 generates as output signals up_csd 128 and dn_csd 126 coming from Cycle slip detection 116, P 160 coming form tdc 124, Dph 158 coming from tdc 124, done 152 coming from the Start/Stop logic 114. FSM (finite state machine) 132 receives as input signals up_csd 128 and dn_csd 126 coming from Cycle slip detection 116, P 160 coming from tdc 124, Dph 158 coming from tdc 124, and done 152 coming from the Start/Stop logic 114. FSM 132 generates as output signals FCW (Frequency Control Word) 134, a clear signal (clear) 154, and a frequency update signal (f_update) 156.

As illustrated in FIG. 1 is the architecture of a fast frequency acquisition/control unit. It has a PFD 106, a Cycle slip detection block 116, a tdc 124 and Start/Stop logic 114 and Arbit logic 112, and a FSM 132. A PFD detects the frequency/phase error information between two input clock signals and generates two signals. In the current embodiment as shown, PFD 106 detects the frequency/phase error information between two input clock signals, i.e. REFCLK 102 and FBCLK 104, and generates UP and DN signals (108 and 110 respectively) corresponding to REFCLK 102 and FBCLK's 104 transition (e.g. rising edge in this case), respectively. Start/Stop logic 114 generates control signals (start 122 and stop 120) for tdc 124 to quantize the UP/DN pulse difference coming from the UP 108 and DN 110 signals of PFD 106, and Arbit logic 112 decides which edge comes first for one cycle operation (i.e. a measurement cycle). This allows the tdc 124 to quantize the UP/DN 108/110 pulse difference. In this approach, two consecutive phase differences are measured by TDC 150 and stored. A FSM 132 (which includes successive approximation logic) will estimate the instant period difference or frequency difference based on the digitized phase information and adjust the digital frequency control variables, such as, but not limited to, a voltage potential in a PLL loop filter capacitor, a VCO coarse tuning word, a LC-VCO (LC-tank based VCO) band calibration, a DCO frequency control word (FCW), a feedback divider ratio, etc. The digital frequency control word is updated every two REFCLK 102 or FBCLK 104 cycles, and FBCLK 104 frequency can be adjusted to close (i.e. frequency) with REFCLK 102 quickly within accuracy of tens of picoseconds resolution via using the TDC 150.

The PFD 106 experiences cycle slips whenever one or more clock transitions (either REFCLK 102 or FBCLK 104) occurs between 2 consecutive PFD reset operations (which are controlled by signal clear 154). The cycle slip indicator signals up_csd 128 and dn_csd 126 directly contains period information related to the PFD 106 input clocks 102 REFCLK and 104 FBCLK, and can be used to control frequency tuning.

If there is no cycle slip then the phase or period difference between REFCLK 102 and FBCLK 104 can be measured with the TDC 150.

Figure 2A:
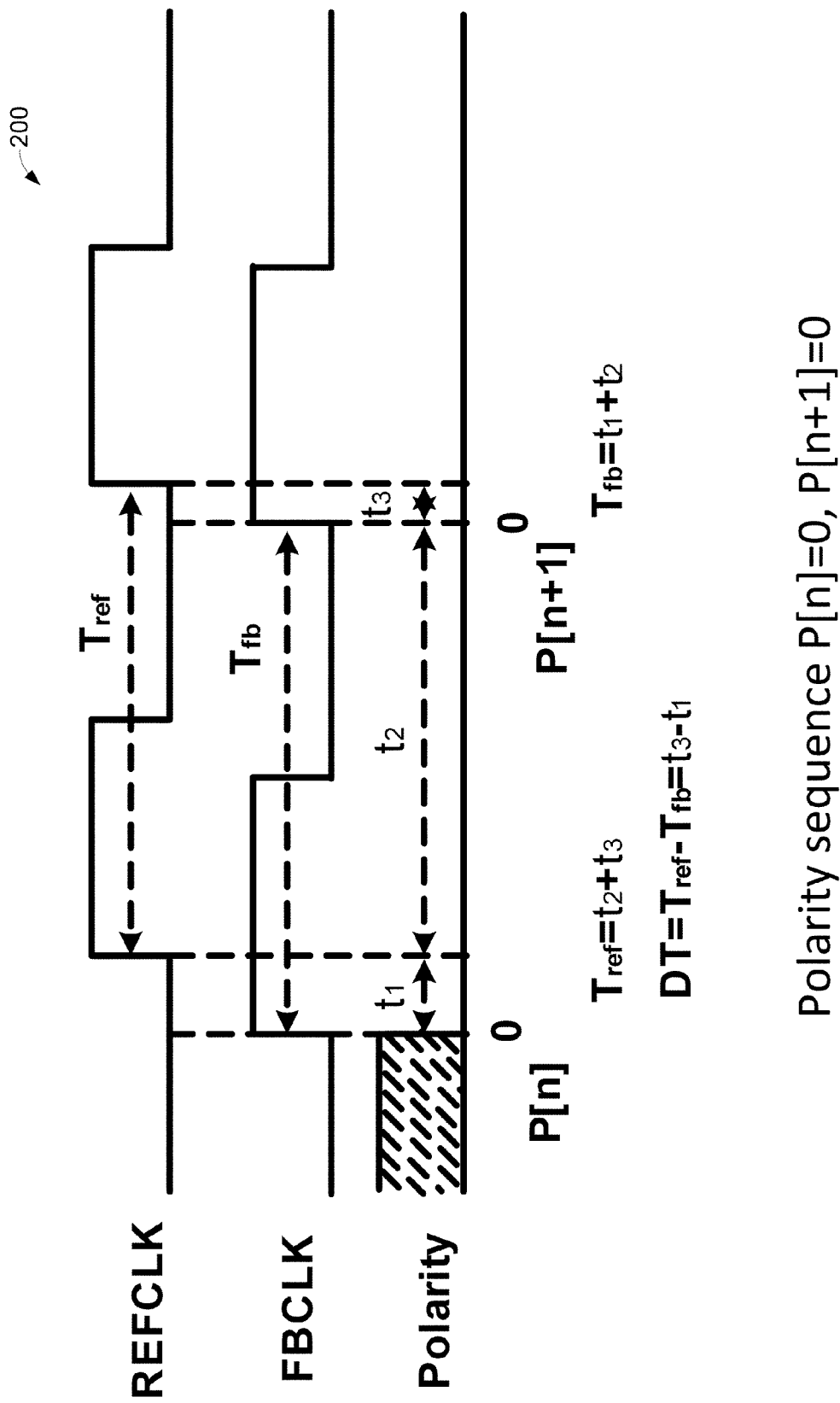
FIG. 2A, FIG. 2B, FIG. 2C, and FIG. 2D illustrate various embodiments of the invention showing the timing measurement principle used.
Figure 2B:
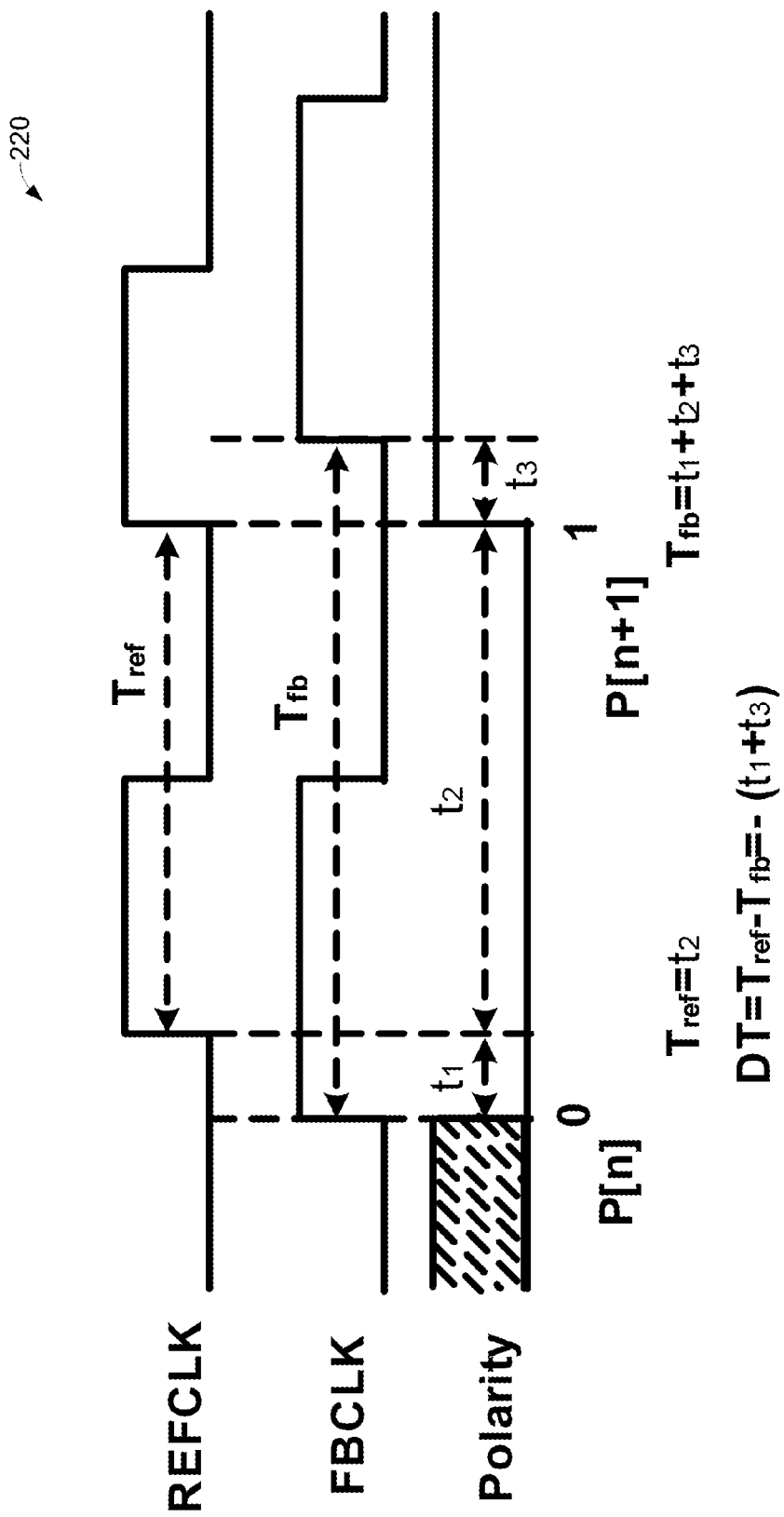
Figure 2C:
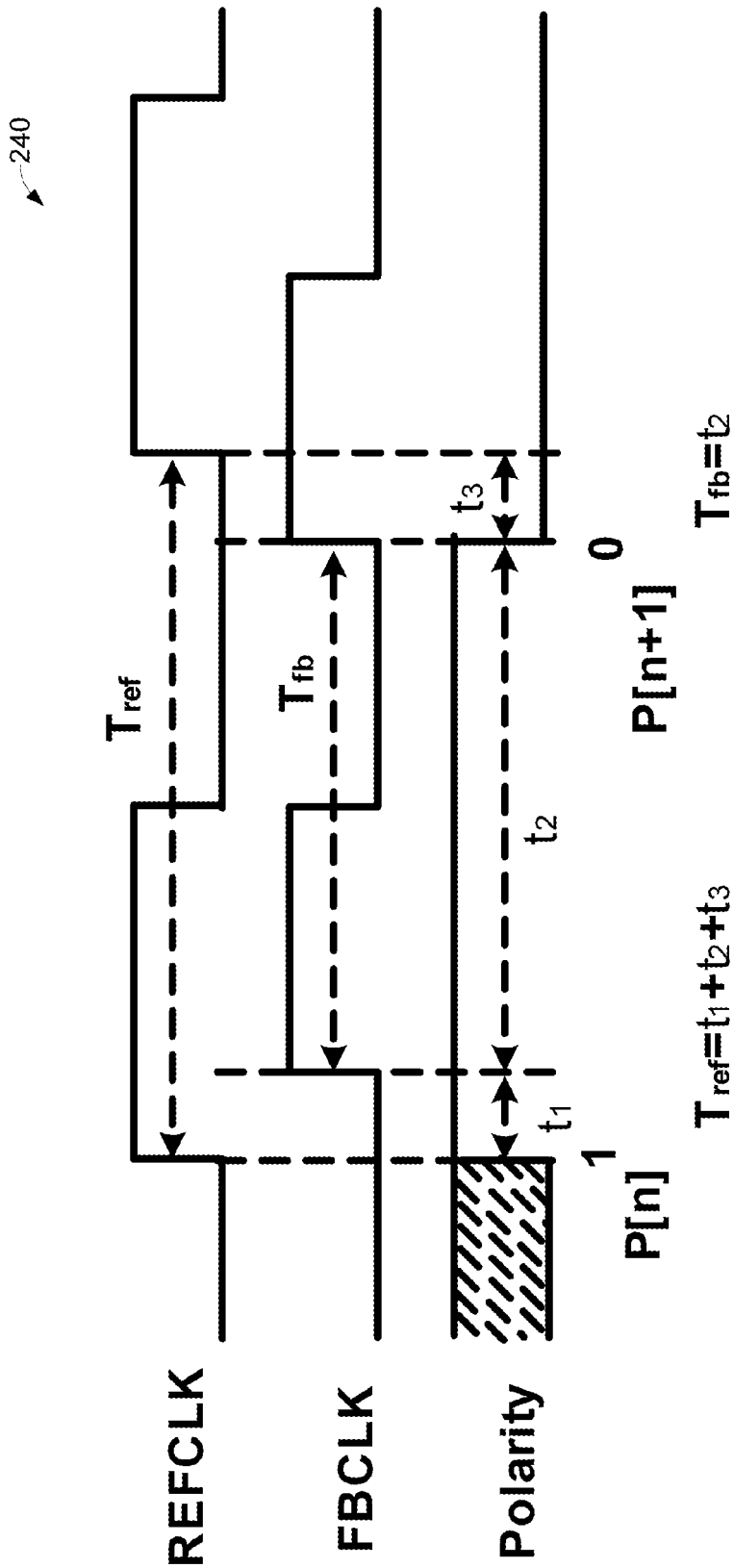
Figure 2D:
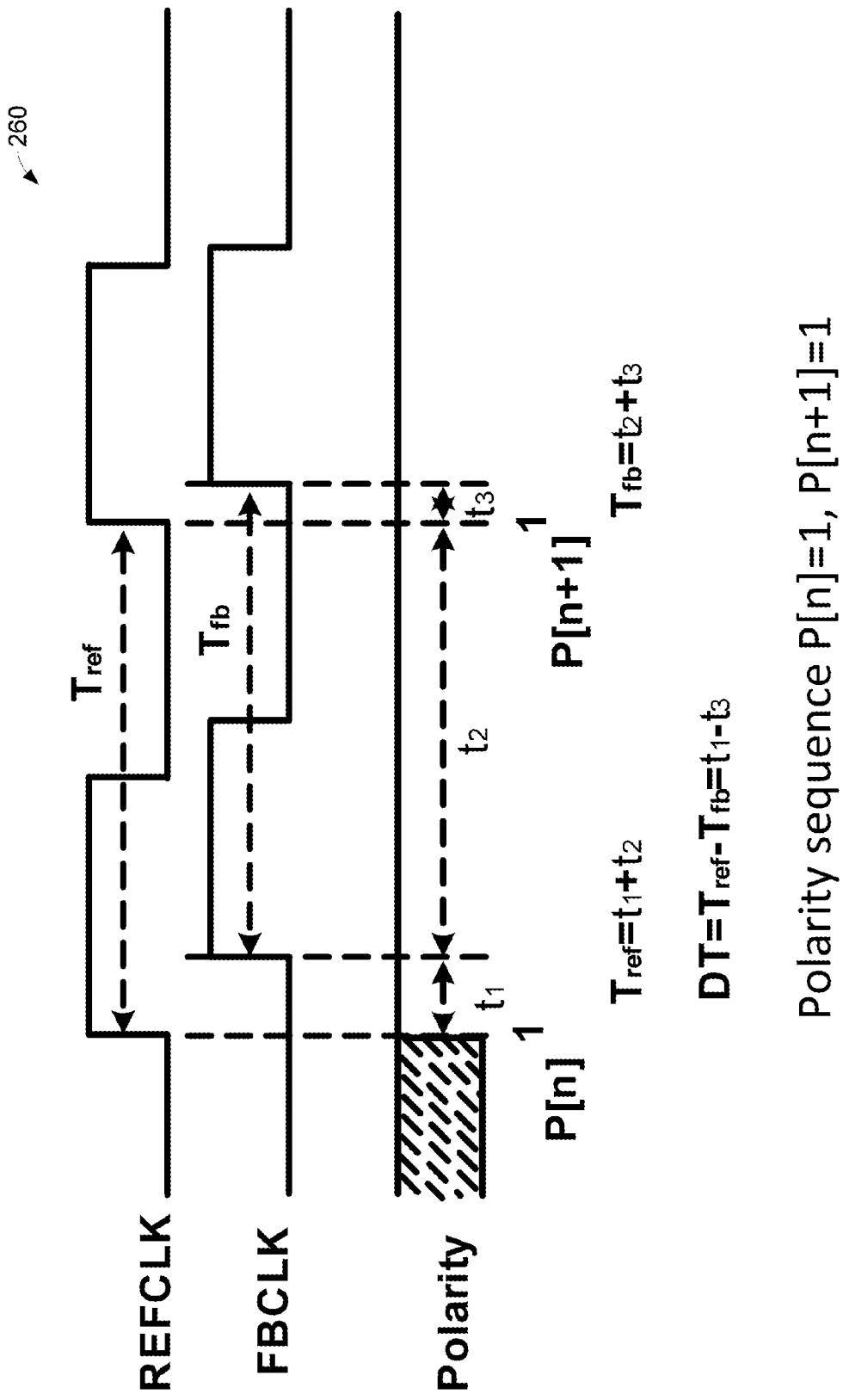

FIG. 2A, FIG. 2B, FIG. 2C, and FIG. 2D illustrate, generally at 200, 220, 240, and 260 respectively embodiments of the invention showing the timing measurement principle used and Table 1 below shows the corresponding FSM (e.g. FIG. 1 at 132) decision logic. FIG. 2A shows the polarity sequence P[n]=0, P[n+1]=0. FIG. 2B shows the polarity sequence P[n]=0, P[n+1]=1. FIG. 2C shows the polarity sequence P[n]=1, P[n+1]=0. FIG. 2D shows the polarity sequence P[n]=1, P[n+1]=1.

For example, if we suppose REFCLK 102 period is Tref and FBCLK 104 period is Tfb, the instant period difference (DT) can be calculated with two consecutive phase measurements using TDC 150. It is easy to find out if the instant period difference DT is larger than 0 or not, i.e., the FBCLK 104 is faster than the REFCLK 102 when DT is larger than 0 and the FBCLK 104 is slower than the REFCLK 102 when DT is less than 0. Then the FSM will generate an internal signal INC/DECb to show the status and a binary search (sometimes called successive approximation) technique is implemented within the FSM to generate the FCW (frequency control word) to control the frequency of FBCLK 104. We call these two consecutive phase measurements as one period difference measurement. The frequency control word (FCW) 134 will update once every period difference measurement. This update is indicated by signal f_update 156.

TABLE 1

Table 1. Decision table

| input | | output | | |
|---|---|---|---|---|
| P[n] | P[n + 1] | Abs(DT) > $T_{thres}$? | STAY/EXITb | Freq INC/DECb |
| 0 | 0 | 1 | 1 | 0 |
|   |   | 0 | 0 | x |
| 0 | 1 | 1 | 1 | 1 |
|   |   | 0 | 0 | x |
| 1 | 0 | 1 | 1 | 0 |
|   |   | 0 | 0 | x |
| 1 | 1 | 1 | 1 | 1 |
|   |   | 0 | 0 | x |

In actual practice, there is always the possibility of meta-stability issues for an output signal. To address this, in one embodiment of the invention, the Arbit logic 112 output Polarity signal 118, and the Start/Stop logic 114 output signals start 122 and stop 120 will have some meta-stability at edge transition, so a threshold Tthres (corresponding to ppm of target period) is applied for DT decision making. If abs(DT) (the absolute value of DT) is larger than the threshold Tthres, it means there is quite a large period difference or frequency difference between FBCLK (e.g. FIG. 1 at 104) and REFCLK (e.g. FIG. 1 at 102). If abs(DT) is less than the threshold Tthres, it means FBCLK (e.g. FIG. 1 at 104) and REFCLK (e.g. FIG. 1 at 102) are close enough, and the FSM (e.g. FIG. 1 at 132) will stop the frequency binary search process and enter the next stage process, for example, phase acquisition.

Figure 3:
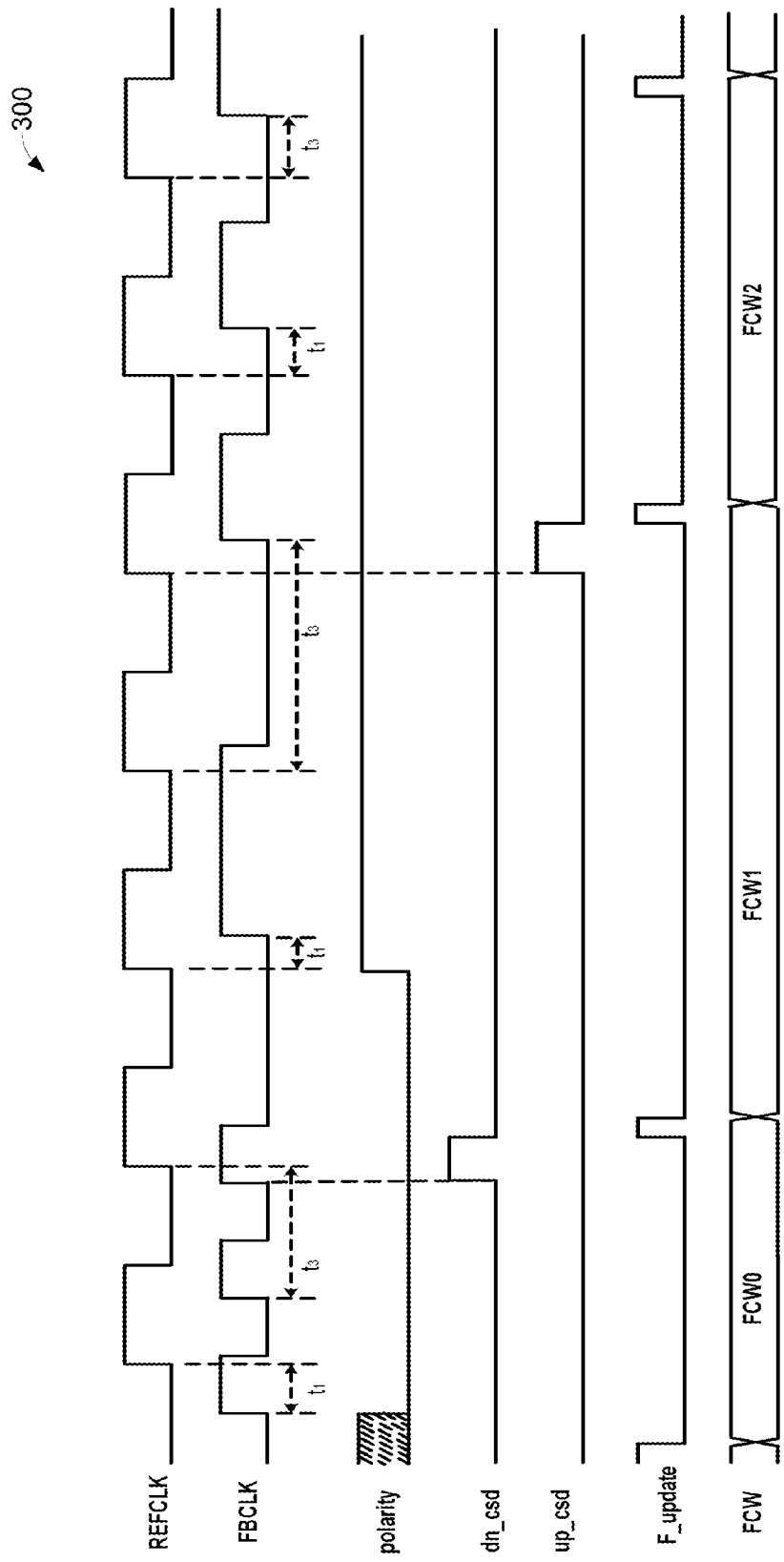
FIG. 3 illustrates one embodiment of the invention showing an example timing of 3 consecutive frequency control word (FCW) updating.
Figure 4:
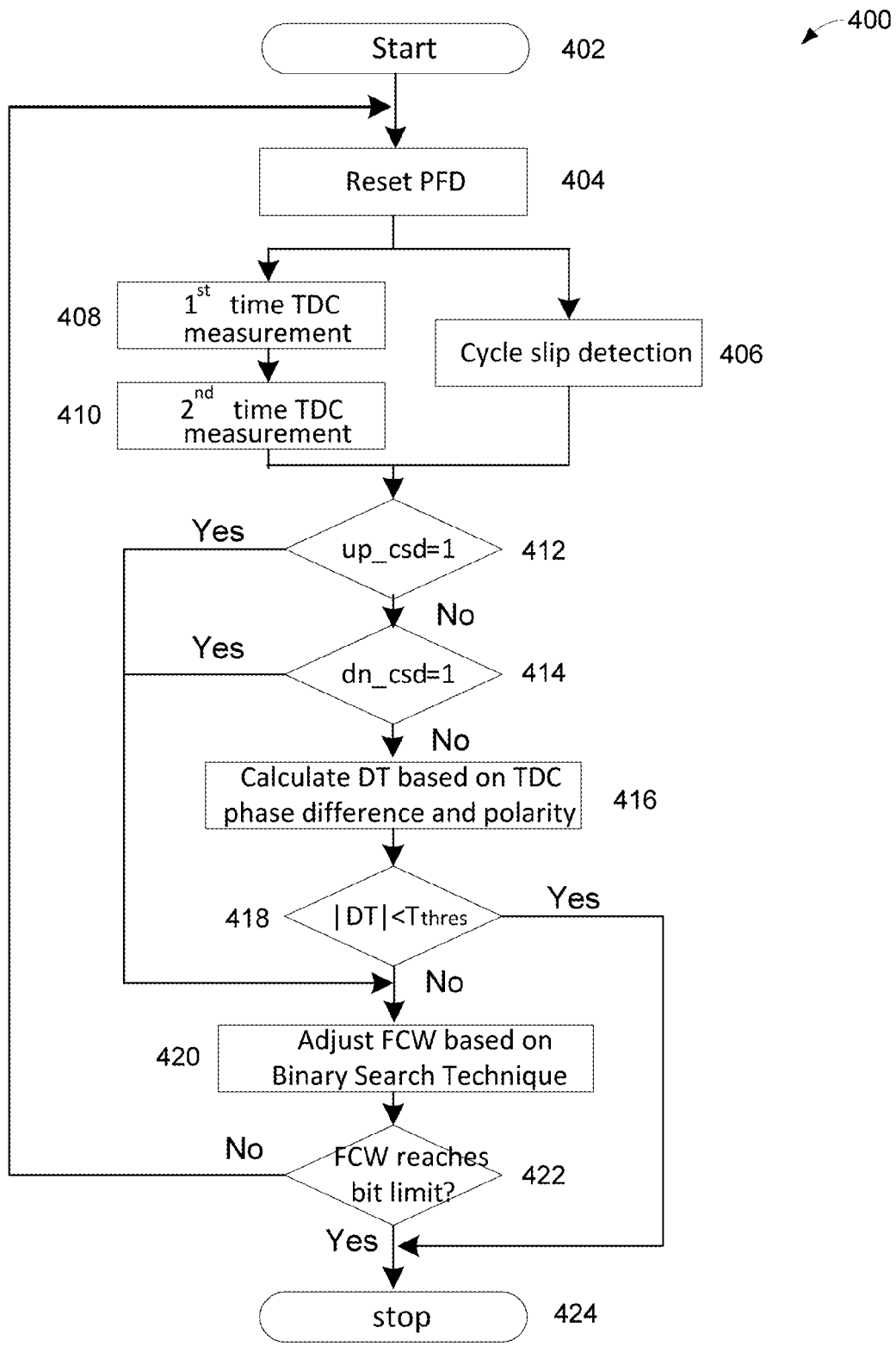
FIG. 4 illustrates one embodiment of the invention showing a flow chart.

FIG. 3 illustrates, generally at 300, one embodiment of the invention showing an example timing of 3 consecutive frequency control word (FCW) updating and FIG. 4 illustrates, generally at 400, one embodiment of the invention showing the FSM 132 flow chart processes every frequency control word updating. At the beginning, the frequency control word is reset to be FCW0 and FBCLK is running at an initial clock rate. In the 1st period difference measurement cycle, a DN_CSD event indicates FBCLK is higher than REFCLK, and the frequency control word changes to FCW1. In the 2nd period difference measurement cycle, a UP_CSD indicates FBCLK frequency is lower than REFCLK, and the frequency control word changes to FCW2. In the 3rd period difference measurement cycle, there is no cycle slip shown so the next frequency control word update will be based on FIGS. 2A, 2B, 2C, and 2D, and a Table 1 decision.

As shown in FIG. 4, the process starts at 402 Start. At 404 the PFD is reset. After the PFD reset there is a first TDC measurement at 408 and a second TDC measurement at 410 and a cycle slip detection at 406. At 412 a determination is made if up_csd=1 412 and if so then proceed to adjust the FCW (frequency control word, for example of a DCO (digitally controlled oscillator) to change its frequency) based on a binary search technique at 420. If the determination is made that up_csd#1 412 then proceed to 414. At 414 a determination is made if dn_csd=1 and if so then proceed to adjust the DCO FCW based on a binary search technique at 420. If the determination is made that dn_csd#1 414 then proceed to 416. At 416 calculate DT based on the TDC phase difference and polarity then proceed to 418 where a determination is made if |DT|<Tthres and if so then proceed to 424 where the adjustment process stops. If at 418 a determination is made that |DT|>=Tthres then proceed to 420 and adjust the DCO FCW based on a binary search technique, then proceed to 422 and determine if the FCW has reached its bit limit and if No then proceed to reset the PFD at 404 and continue the process. If at 422 the FCW has reached its bit limit then proceed to 424 where the process stops.

Figure 5:
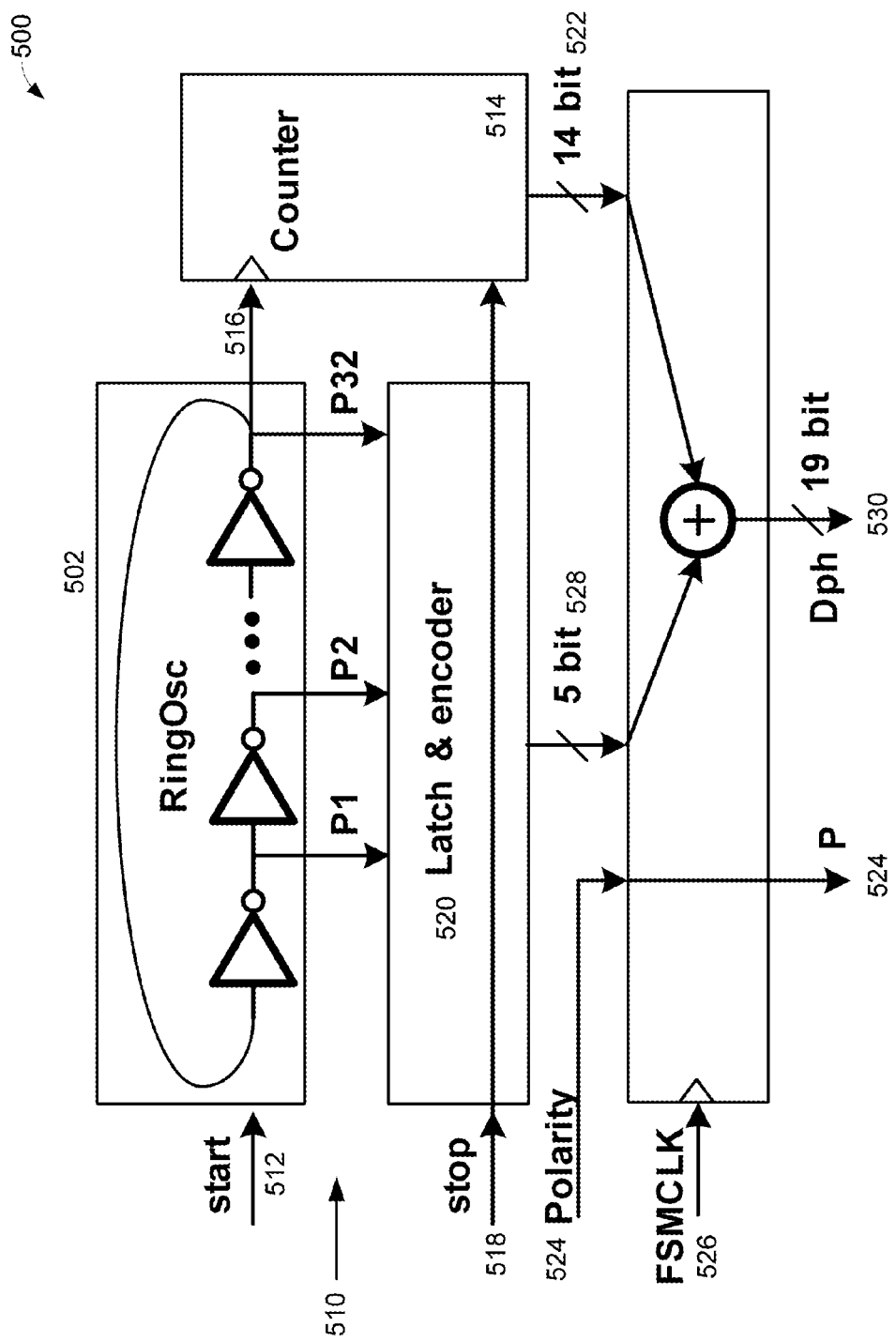
FIG. 5 illustrates one embodiment of the invention showing an example of a time to digital converter implementation.

FIG. 5 illustrates, generally at 500, one embodiment of the invention showing an example of a tdc implementation (for example, most of tdc 124 in FIG. 1). Ring oscillator RingOsc 502 generates high speed multi-phase clocks P1, P2, . . . , P32 (as indicated at 510). When a "start" signal (start) 512 is logic high, the counter (Counter) 514 will calculate coarse phase by counting the number of "P32" pulses 516, when "stop" signal (stop) 518 is logic high, the latch (Latch & encoder) 520 will lock the RingOsc 502 clock phase status and encode it to be a fine phase (5 bit) 528, at the same time, the counter 524 value 522 (14 bit) will be held as coarse. The coarse 522, fine phase 528, and polarity (Polarity and P) 524 are synchronized by system clock FSMCLK 526 and combined to provide the FSM 132 complete phase information (Dph) 530.

With the implementation as shown in FIG. 5, a TDC resolution of 100 ps can be easily implemented in a modern CMOS process, and the TDC can achieve a timing accuracy of 1000 ppm with only 2 consecutive TDC measurements for a 1 MHz reference clock. If we assume a 12-bit frequency control word is used to control a DCO, this approach will achieve an accuracy of $1/(2^{12})$ or 250 ppm within 12×2 REFCLK cycles using this method.

However, the invention is not so limited and a larger frequency control word may be used.

Figure 6:
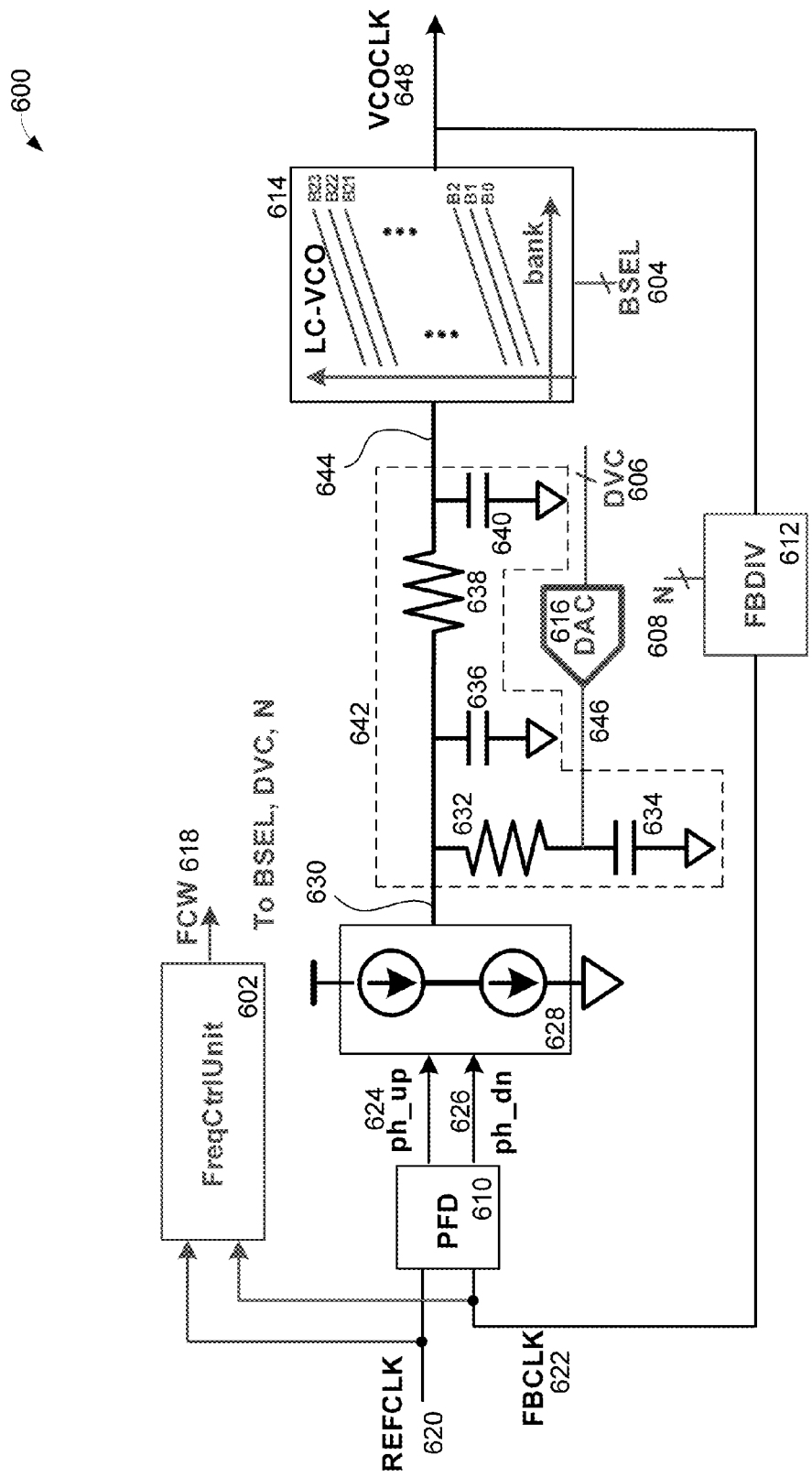
FIG. 6 illustrates one embodiment of the invention showing application in an analog PLL system.

Within a frequency range, this frequency control unit disclosed can be used to tune all frequency related objects with a significant convergence time improvement, for example, but not limited to a VCO coarse tune, a LC-VCO bank selection, a loop capacitor voltage potential preset, a feedback divider ratio preset, etc, as shown for example in FIG. 6. More specifically the techniques disclosed can be used to speed-up the frequency acquisition in a very narrow bandwidth (for example, 1 Hz or lower) frequency/phase locked loop, as shown for example in FIG. 7 with a digital PLL implementation. One of skill in the art will appreciate that some of the hardware, for example, the PFD, tdc, could be shared or re-used from the loop. For illustration purposes we have, in some cases, duplicated what could be shared or re-used.

FIG. 6 illustrates, generally at 600, one embodiment of the invention showing application in an analog PLL system. Here at 602 is the FreqCtrlUnit (frequency control unit) which outputs a FCW signal 618 that can be used for the LC-VCO bank select BSEL at 604 (showing 24 banks as an example (B0 . . . B23)), the voltage control signal DVC at 606 going to the DAC (digital to analog converter) 616, and the feedback divider N signal at 608 going to the FBDIV 612 (feedback divider circuit), at 610 is a PFD (phase frequency detector). In the embodiment shown in FIG. 6, the PFD 610 determines the phase/frequency difference between the input signals REFCLK 620 and FBCLK 622 and generates output signals ph_up 624 and ph_dn 626 to indicate such. At 628 is shown a charge pump. A charge pump generates an output current based on one or more inputs. In the embodiment as shown charge pump 628 is coupled to receive signals ph_up 624 and ph_dn 626. In the embodiment as shown charge pump 628 outputs a current signal 630 which is shown coupled to filtering network 642. A filtering network takes an input signal and generates an output signal that is different in some way from the input signal. In the embodiment as shown the filtering network 642 includes a resistor 632, a capacitor 634, a capacitor 636, a resistor 638, and a capacitor 640. At 614 is a LC-VCO with banks (inductor capacitor voltage controlled oscillator with banks of inductors-capacitors). A LC-VCO with banks is a voltage controlled oscillator having a series of inductors and capacitors arranged in banks where each bank can be selected and has a different inductor-capacitance value. Alternatively each selected bank may be considered to have a different impedance. As such depending upon which inductor-capacitor bank is selected the voltage controlled oscillator will have a different oscillation frequency range based upon which inductor-capacitor impedance is selected and then based upon the voltage applied to that oscillator. In the embodiment as shown LC-VCO with banks 614 is indicated to have 24 banks of inductance-capacitance values denoted as B0, B1, B2, . . . , B21, B22, B23 the selection of which is controlled by a bank select signal. In the embodiment as shown LC-VCO with banks 614 has a bank select input BSEL 604 which is coupled to receive a bank select signal. The bank select signal goes to a bank selection logic block which will select the inductor-capacitor for a given bank. An LC-VCO with banks will generate an output signal based upon an input voltage signal and a bank select signal. In the embodiment as shown LC-VCO with banks 614 is coupled to receive input signal 644 which is an output signal from filtering network 642, is coupled to receive a bank select signal 604 from the output signal FSW 618 of FreqCtrlUnit 602, and generates an output signal VCOCLK 648. A feedback divider is a circuit that takes in a signal and generates an output which is a fractional representation of the input signal. In the embodiment as shown FBDIV (feedback divider) 612 is coupled to receive as input VCOCLK 648 and generate an output signal FBCLK 622. In one embodiment of the invention a feedback divider has an additional input which can determine the fractional. In the embodiment of the invention as shown FBDIV 612 has an input N 608 for receiving a signal to indicate the fractional. That fractional signal is received from the output signal FSW 618 of FreqCtrlUnit 602. A frequency control unit generates signals to control the frequency of another signal. In the embodiment as shown in FIG. 6, the frequency control unit FreqCtrlUnit 602 generates signals FCW 618 to control the frequency of signal VCOCLK 648. As noted FCW 618 goes to BSEL 604 which selects an inductor-capacitor bank which affects the frequency of VCOCLK 648, FCW 618 also goes to N 608 which affects the frequency of VCOCLK 648, and FCW 618 goes to DVC 606 which controls the output signal voltage 646 of DAC 616. The signal voltage 646 is received by the filtering network 642 and affects the network filtering 642 output signal 644 which is the voltage which also affects the frequency of the voltage controlled oscillator in the LC-VCO with banks 614 which outputs the frequency signal VCOCLK 648. In one embodiment of the invention as shown the FreqCtrlUnit 602 receives additional input signals REFCLK 620 and FBCLK 622. In one embodiment of the invention, FreqCtrlUnit 602 may be, but is not limited to, an embodiment as illustrated in FIG. 1.

Figure 7:
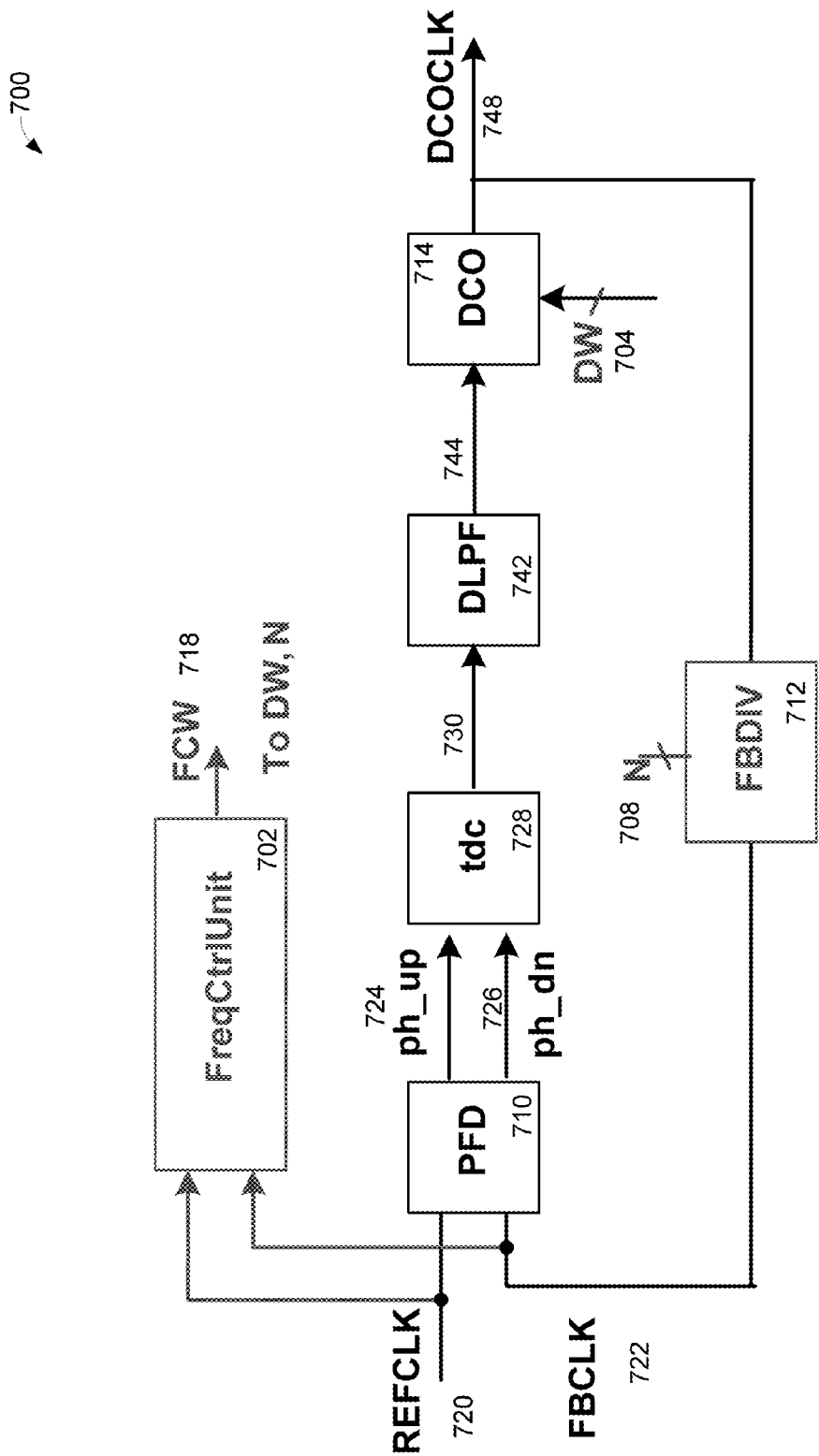
FIG. 7 illustrates one embodiment of the invention showing application in a narrow bandwidth digital PLL system.

FIG. 7 illustrates, generally at 700, one embodiment of the invention showing application in a narrow bandwidth digital PLL system. Here at 702 is the FreqCtrlUnit (frequency control unit) which outputs a FCW signal 718 that can be used for controlling the DCO (digitally controlled oscillator) 714 via DW (digital word) 704, and the feedback divider N at 708. The feedback divider N signal at 708 going to the FBDIV 712 (feedback divider circuit), at 710 is a PFD (phase frequency detector). In the embodiment shown in FIG. 7, the PFD 710 determines the phase/frequency difference between the input signals REFCLK 720 and FBCLK 722 and generates output signals ph_up 724 and ph_dn 726 to indicate such. At 728 is shown a TDC (time to digital converter). A time to digital converter converts a time into a digital representation. In the embodiment as shown TDC 728 is coupled to receive signals ph_up 724 and ph_dn 726. In the embodiment as shown TDC 728 outputs a digital signal 730 which is shown coupled to a DLPF (digital low pass filter) 742. A digital low pass filter takes an input signal and generates an output signal that has some of the high frequency components removed. In the embodiment as shown the DLPF 742 receives an input signal 730 and generates an output signal 744 which goes to the DCO (digitally controlled oscillator) 714. A DCO is an oscillator whose output frequency is controlled digitally. As such depending upon what digital input is received the DCO generates an output frequency. In the embodiment as shown the DCO 714 generates an output signal DCOCLK (digitally controlled oscillator clock) 748. In the embodiment as shown DCO 714 receives 744 a digital signal from the DLPF 742 and DW 704 from FCW 718. A feedback divider is a circuit that takes in a signal and generates an output which is a fractional representation of the input signal. In the embodiment as shown FBDIV (feedback divider) 712 is coupled to receive as input DCOCLK 748 and generate an output signal FBCLK 722. In one embodiment of the invention a feedback divider has an additional input which can determine the fractional. In the embodiment of the invention as shown FBDIV 712 has an input N 708 for receiving a signal to indicate the fractional. That fractional signal is received from the output signal FSW 718 of FreqCtrlUnit 702. A frequency control unit generates signals to control the frequency of another signal. In the embodiment as shown in FIG. 7, the frequency control unit FreqCtrlUnit 702 generates signals FCW 718 to control the frequency of signal DCOCLK 748. FCW 718 goes to DW 704 which affects the frequency of DCOCLK 748, FCW 718 also goes to N 708 which affects the frequency of DCOCLK 748. In one embodiment of the invention as shown, the FreqCtrlUnit 702 receives additional input signals REFCLK 720 and FBCLK 722. In one embodiment of the invention, FreqCtrlUnit 702 may be, but is not limited to, an embodiment as illustrated in FIG. 1.

Figure 8:
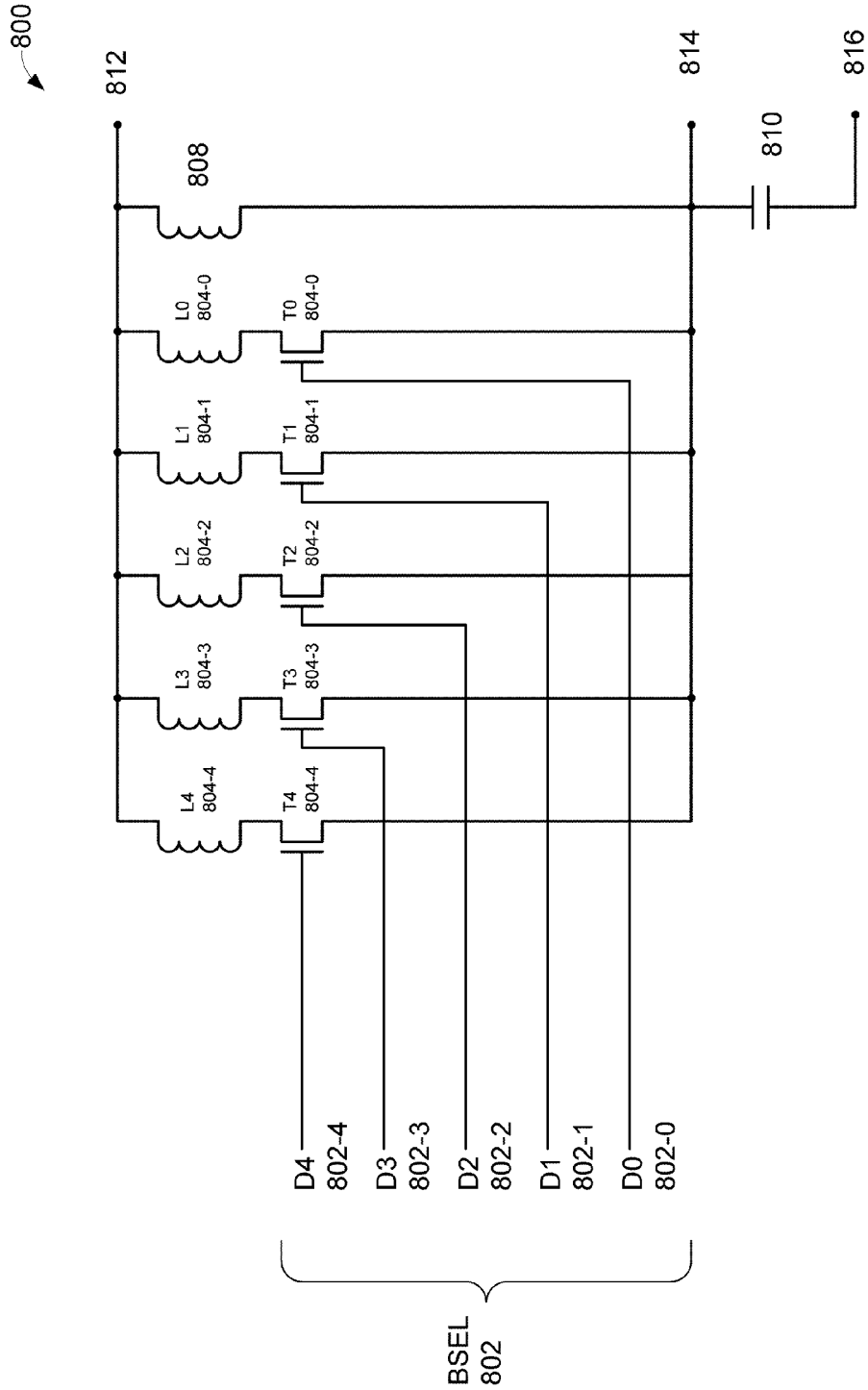
FIG. 8 illustrates, one embodiment of the invention showing a bank selection logic block.
Figure 23:
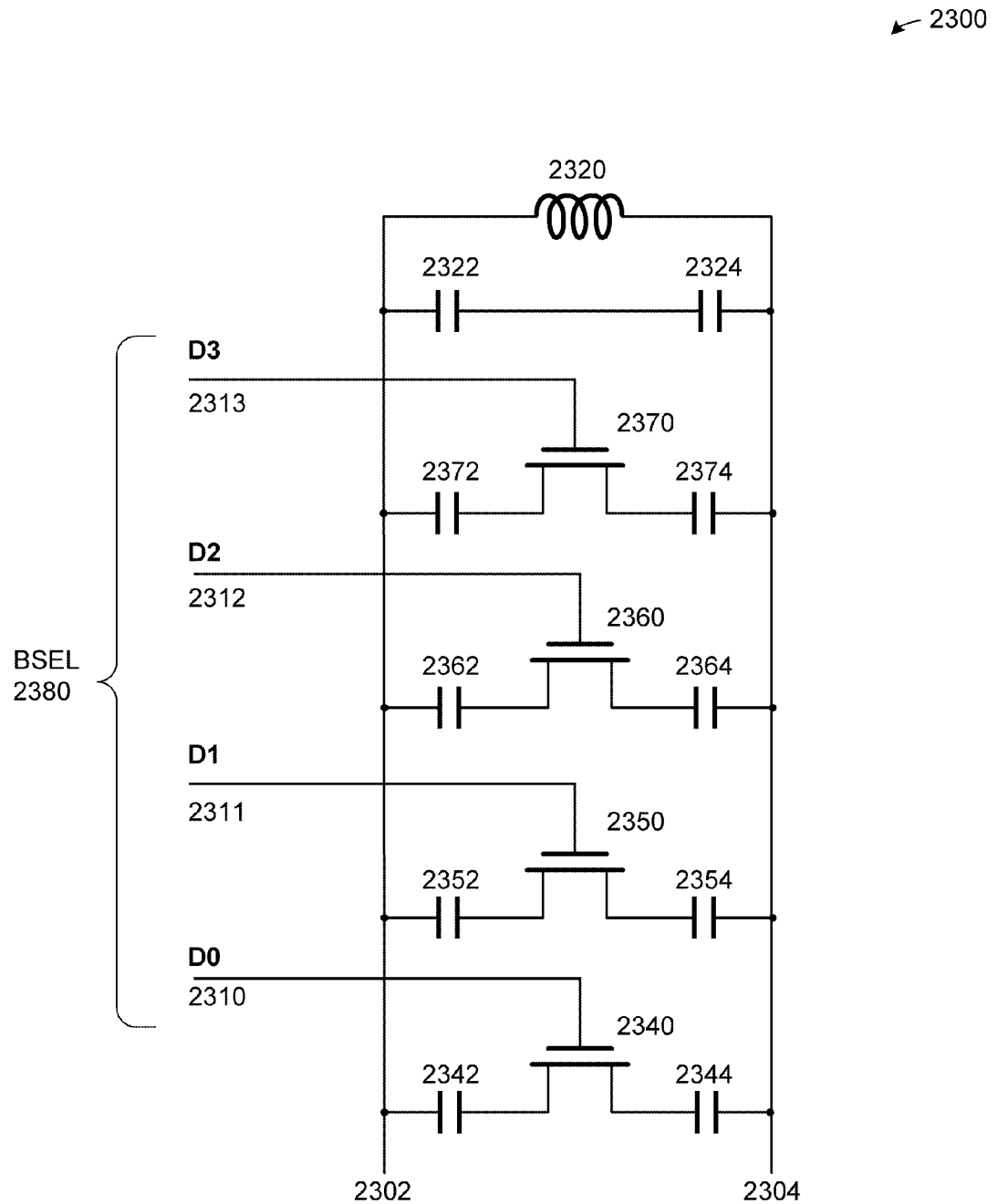
FIG. 23 illustrates, one embodiment of the invention showing a bank selection logic block.

FIG. 8 illustrates, generally at 800, one embodiment of the invention showing a bank selection logic block. BSEL 802 receives the bank select signal, which in this embodiment is shown as D0, D1, D2, D3, and D4 (802-0, 802-1, 802-2, 802-3, 802-4 respectively) which each respectively goes to a transistor T0, T1, T2, T3, and T4 (804-0, 804-1, 804-2, 804-3, 802-4 respectively) for switching on/off said transistor and selecting or not selecting inductors L1, L2, L3, and L4 (806-0, 806-1, 806-2, 806-3, 806-4 respectively). to be active/inactive in the circuit. Inductor 808 and capacitor 810 form an LC network across which BSEL 802 controls additional inductances L1, L2, L3, and L4 which can be in parallel with inductor 808. Nodes 812, 814, and 816 would connect to the LC oscillator circuit and BSEL 802 now can select the banks of inductors for frequency control. One of skill in the art will appreciate that there are other embodiments possible for a bank selection logic block. For example, similar to FIG. 8, an alternative embodiment might have the component at 810 being an inductor, with the components at 808, and 804-0, 804-1, 804-2, 804-3, 802-4 being capacitors. One such embodiment is illustrated in FIG. 23.

A voltage controlled oscillator, denoted VCO, is a non-transitory hardware based device that takes as an input a transitory input voltage signal and generates a transitory oscillating output voltage signal whose frequency is based on the transitory input voltage signal.

FIG. 9 illustrates, generally at 900, an embodiment of a VCO in block diagram form. At 902 is a transitory input voltage signal, which goes into the VCO non-transitory hardware based device 904, which then generates a transitory oscillating output signal 906 whose frequency is based on the transitory input voltage signal 902.

FIG. 10 illustrates, generally at 1000, an embodiment of a VCO 1004 showing a transfer function 1008 in graph form. At 1002 is the transitory input voltage signal voltage level, at 1006 is the transitory oscillating output signal frequency. 1001 indicates an increasing transitory voltage, and 205 indicates an increasing transitory frequency.

FIG. 11 illustrates, generally at 1100, an embodiment of a VCO. Transitory power is supplied at 1102 and 1104, for example, in the form of a positive and ground voltage respectively. At 1106 is a non-transitory hardware device that takes as input the transitory power 1102 and produces at 1108 a transitory signal in the form of a transitory constant current. At 1110 and 1112 are non-transitory devices in the form of inductors which take as input a transitory constant current 1108 and generate a transitory output current signal 1114 and 1116 respectively whose transitory current summation is equal to that of transitory constant current 1108. At 1118 is a transitory input voltage signal which goes to non-transitory hardware devices 1120 and 1122 both of which are in the form of a varactor diode. At 1124 is a transitory oscillating output signal. At 1126 and 1128 are non-transitory transistors that take as inputs the transitory output current signal 1114 and 1116 respectively and generate a transitory signal in the form of a transitory constant current equal in summation to that of transitory constant current 1108 plus any input current from transitory input voltage signal 1118 and minus any current from the transitory oscillating output signal 1124. In operation VCO 1100 is a tuned LC cross-coupled oscillator whose output frequency is adjusted by a voltage adjusting the C.

FIG. 12 illustrates, generally at 1200, an embodiment of a VCO in flow chart form. At 1202 is the transitory input voltage signal. At 1204 a determination is made if the transitory input voltage signal has changed in voltage and if not then take No 1214 back to 1204. If yes then take Yes 1206 to block 1208 where we adjust the transitory oscillating output signal frequency based on the transitory input voltage signal. Then we proceed via 1212 back to 1204. The transitory oscillating output signal is shown at 1210.

A DCO (digitally controlled oscillator) takes as input a digital frequency signal and generates an oscillating output signal based on the digital frequency signal.

Figure 13:
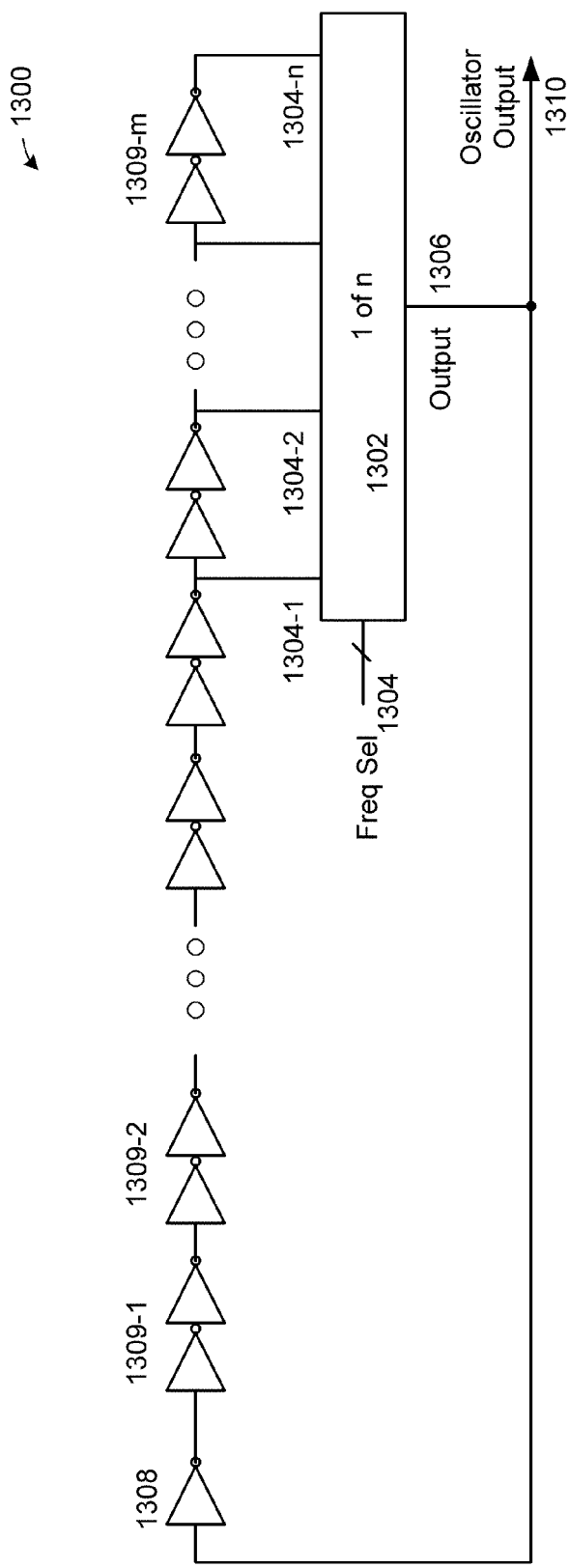
FIG. 13 illustrates one embodiment of a DCO (digitally controlled oscillator).

FIG. 13 illustrates, generally at 1300, one embodiment of a DCO (digitally controlled oscillator). In this embodiment a ring oscillator has a first inverter 1308 followed by pairs of inverters, such as 1309-1, 1309-2, . . . , 1309-m, the pairs acting as delay elements. There are a series of taps on the ring oscillator delay elements 1304-1, 1404-2, . . . , 1304-n, one of which can be selected by the 1 of n selector 1302 which is controlled by the frequency select input (Freq Sel) 1304. The Freq Sel 1304 input is coupled to receive a digital frequency signal. The output of the 1 of n selector 1302 is Output 1306. In operation the Output 1306 supplies an oscillating output signal (Oscillator Output) 1310.

Other embodiments of a DCO are possible, for example, a VCO which uses a DAC to control the voltage to a VCO. Another example is a NCO (numerically controlled oscillator) using phase accumulation and a PAC (phase to amplitude converter). What is to be appreciated is that a DCO uses a digital input (often called a frequency control word) to control the frequency versus an analog voltage used by a VCO.

A DLPF (digital low pass filter) is a device that takes as input a digital input signal and generates a digital output signal where some high frequency components of the digital input signal have been removed.

Figure 14:
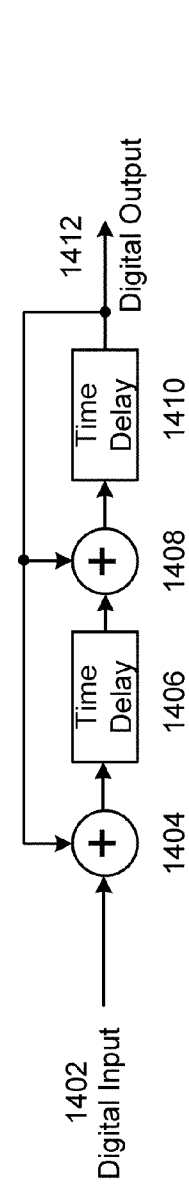
FIG. 14 illustrates one embodiment of a DLPF (digital low pass filter).

FIG. 14 illustrates, generally at 1400, one embodiment of a DLPF (digital low pass filter). At 1402 is a Digital Input which is coupled to receive a digital input signal. At 1412 is a Digital Output which is coupled to send a digital output signal. At 1404 and 1408 are summation units, and at 1406 and 1410 are Time Delay units. A summation unit takes signals from two inputs and generates a summation signal of the two input signals. A Time Delay unit receives as input an input signal and generates an output signal after a fixed amount of time (called the delay) that is the same as the received input signal.

A FSM (finite state machine) is a device that receives input signals and in response proceeds from one state to another possibly generating output signals in the process. A FSM has a fixed number of states (e.g. finite) and can be expressed visually in a state transition diagram which shows states, transitions from states, input signals, and output signals.

Figure 15:
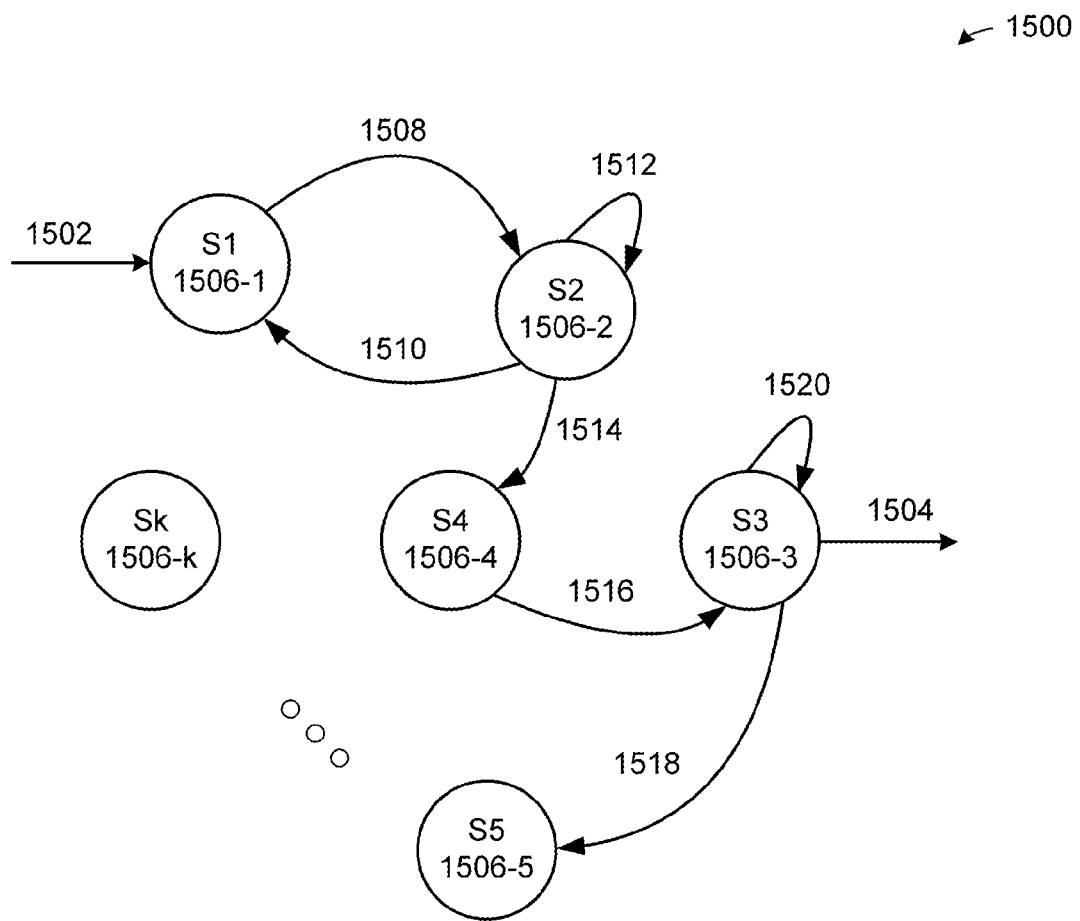
FIG. 15 illustrates one embodiment of a FSM (finite state machine).

FIG. 15 illustrates, generally at 1500, one embodiment of a FSM (finite state machine). At 1502 is an input coupled to receive input signals. At 1504 is an output which generates signals. States are S1, S2, S3, S4, S5, . . . , Sk (1506-1, 1506-2, 1506-3, 1506-4, 1506-5, 1506-k respectively where k is a finite integer number. The interconnection of states and transitions and inputs and outputs is determined by the particular application. Here for, illustrative purposes only we show a transition from S1 1506-1 to S2 1506-2 as shown by transition arrow 1508. Once in state S2 1506-2 there are shown three possible transitions. At 1510 a transition is made back to S1 1506-1. At 1512 a transition is made back to S2 1506-2. At 1514 a transition is made to another state, here denoted as S4. These three possible transitions back to the state where we came, to another state, or to the current state are possible at each state. As illustrated here at 1516 we transition from S4 1506-4 to S3 1506-3 which generates an output signal 1504. Once in state S3 1506-3 we might loop back via 1520 or move to state S5 1506-5 via route 1518. What is to be appreciated is that a FSM is a device that may be designed to perform a particular application.

A binary search or successive approximation is a device (e.g. FSM (finite state machine)) that takes an input signal and via a search determines the value of the input signal.

Figure 16:
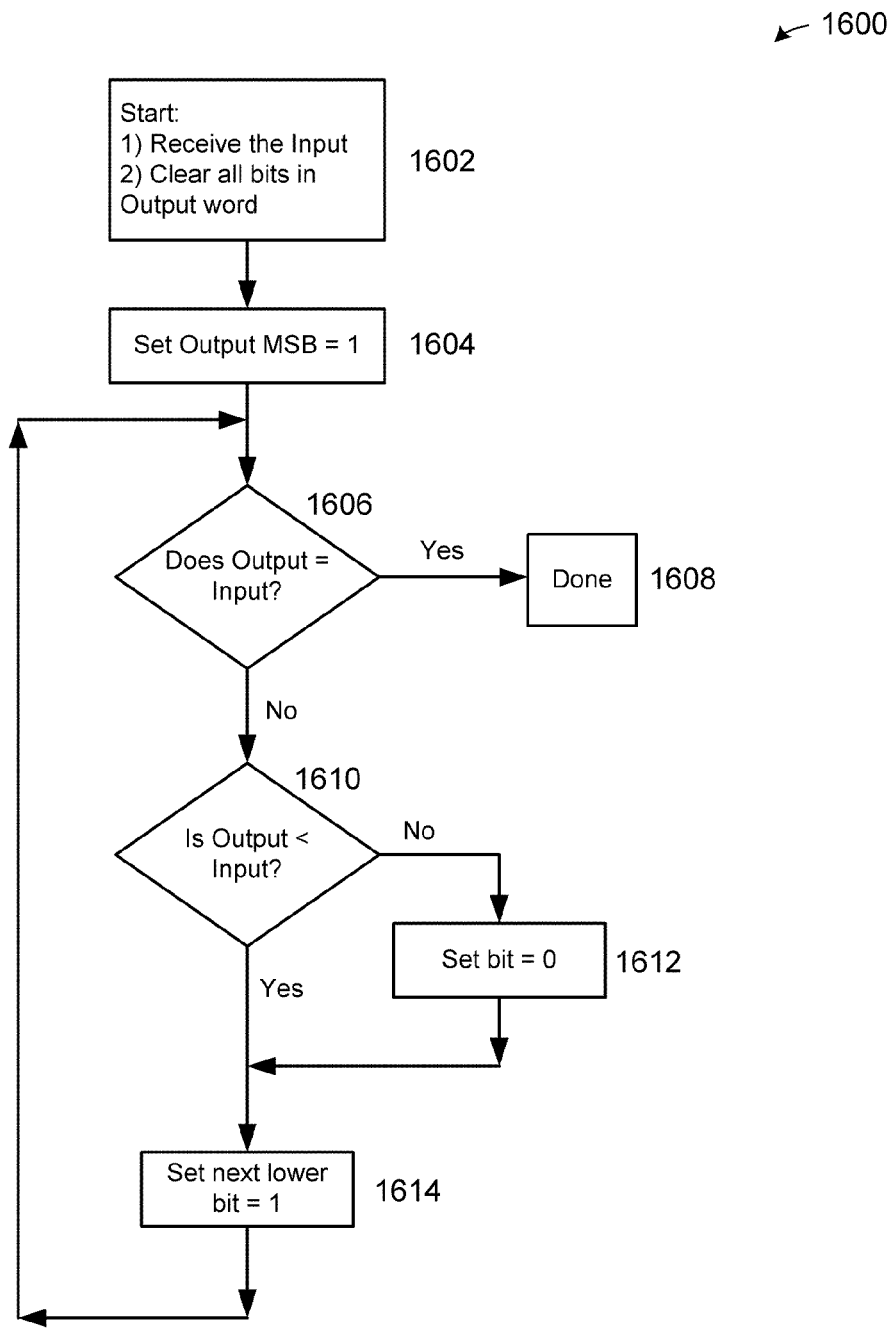
FIG. 16 illustrates one embodiment of a binary search or successive approximation.

FIG. 16 illustrates, generally at 1600, one embodiment of a binary search or successive approximation device implemented as a FSM showing in flow chart form the binary search. For illustration purposes we assume the Input signal and Output signal can be compared and the Output signal is in whatever form is needed for comparison. At 1602 we start by receiving the Input and clearing all bit in the Output word which controls the Output. At 1604 we set the Output MSB=1 (e.g. halfway). At 1606 we compare the output to the input and if they are equal we are Done 1608 and know the value of the Input from the bits as set in the Output word. If the Output does not equal the Input then at 1610 we determine if the Output<Input and if not then at 1612 we set the bit=0 as the Output is too large compared to the Input and then we set the next lower bit=1 at 1614 and proceed to check again at 1606. If the Output is less than the Input then from 1610 we leave the current bit alone and then we set the next lower bit=1 at 1614 and proceed to check again at 1606. In actual implementation the comparison at 1606 has a minimum value that it can discern and so the comparison is within the LSB range.

Figure 17:
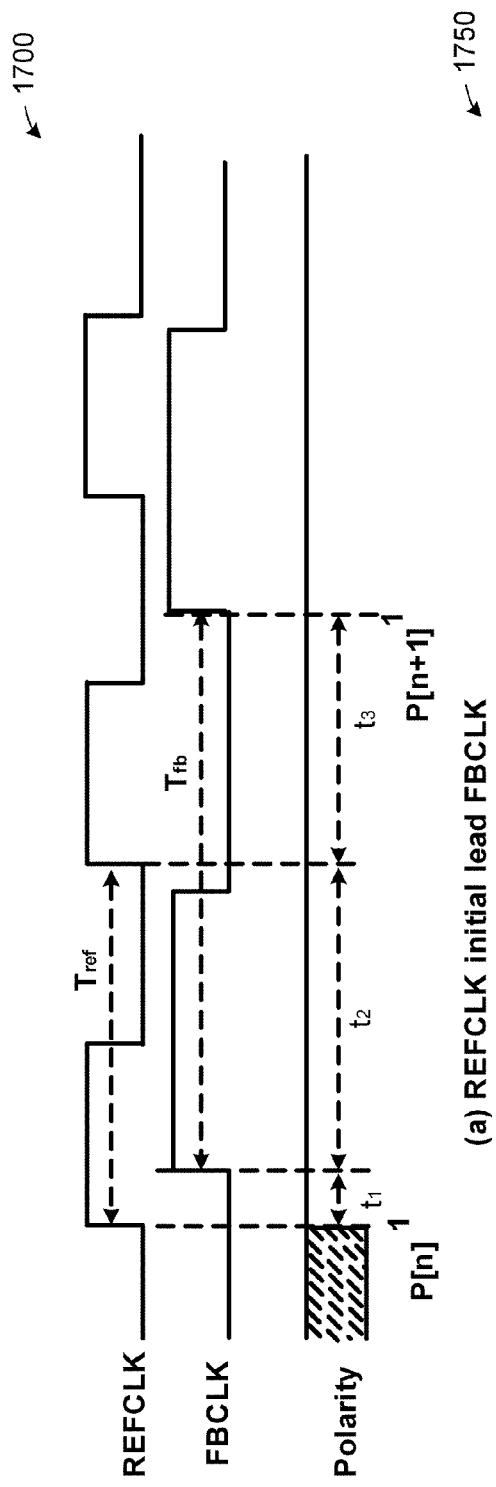
FIG. 17 illustrates embodiments of the invention showing an example of operation timing.
Figure 17:
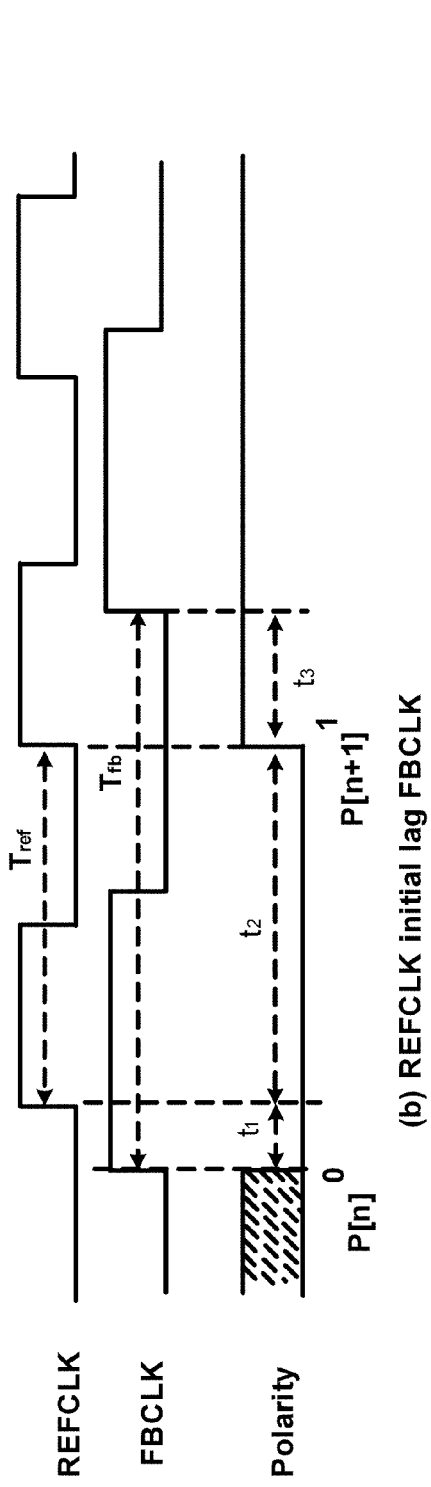

FIG. 17 illustrates, generally at 1700 and 1750, embodiments of the invention showing an example of operation timing. At 1700 is shown REFCLK initially leading FBCLK. At 1750 is shown REFCLK initially lagging FBCLK. If the initial phase difference between REFCLK and FBCLK changes in each frequency measurement cycle, even if the frequency of REFCLK and FBCLK are not changed, it may generate a different polarity value from the circuit. This is an exceptional case and is not fatal and is illustrated in FIG. 17 at 1700 and 1750.

Figure 18:
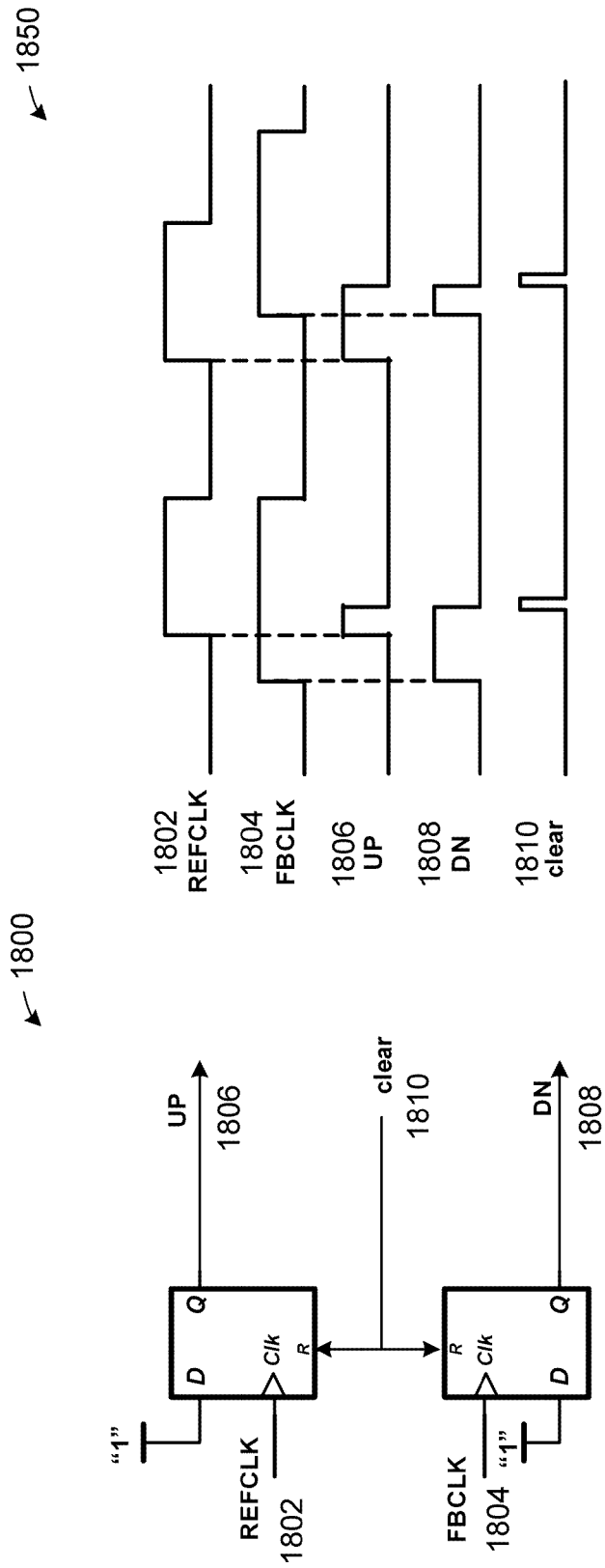
FIG. 18 illustrates embodiments of the invention showing an example of a PFD implementation and operation timing.

FIG. 18 illustrates, generally at 1800 and 1850, embodiments of the invention showing an example of a PFD implementation and operation timing (1800 and 1850 respectively). The PFD 1800 detects frequency/phase error information between two input clocks, i.e. REFCLK 1802 and FBCLK 1804, and generates UP/DN pulse (1806/1808 respectively) corresponding to REFCLK 1802 and FBCLK's 1804 transition (rising edge in this case), respectively. A "clear" 1810 (clear) high pulse will reset the PFD 1800 output status.

Figure 19:
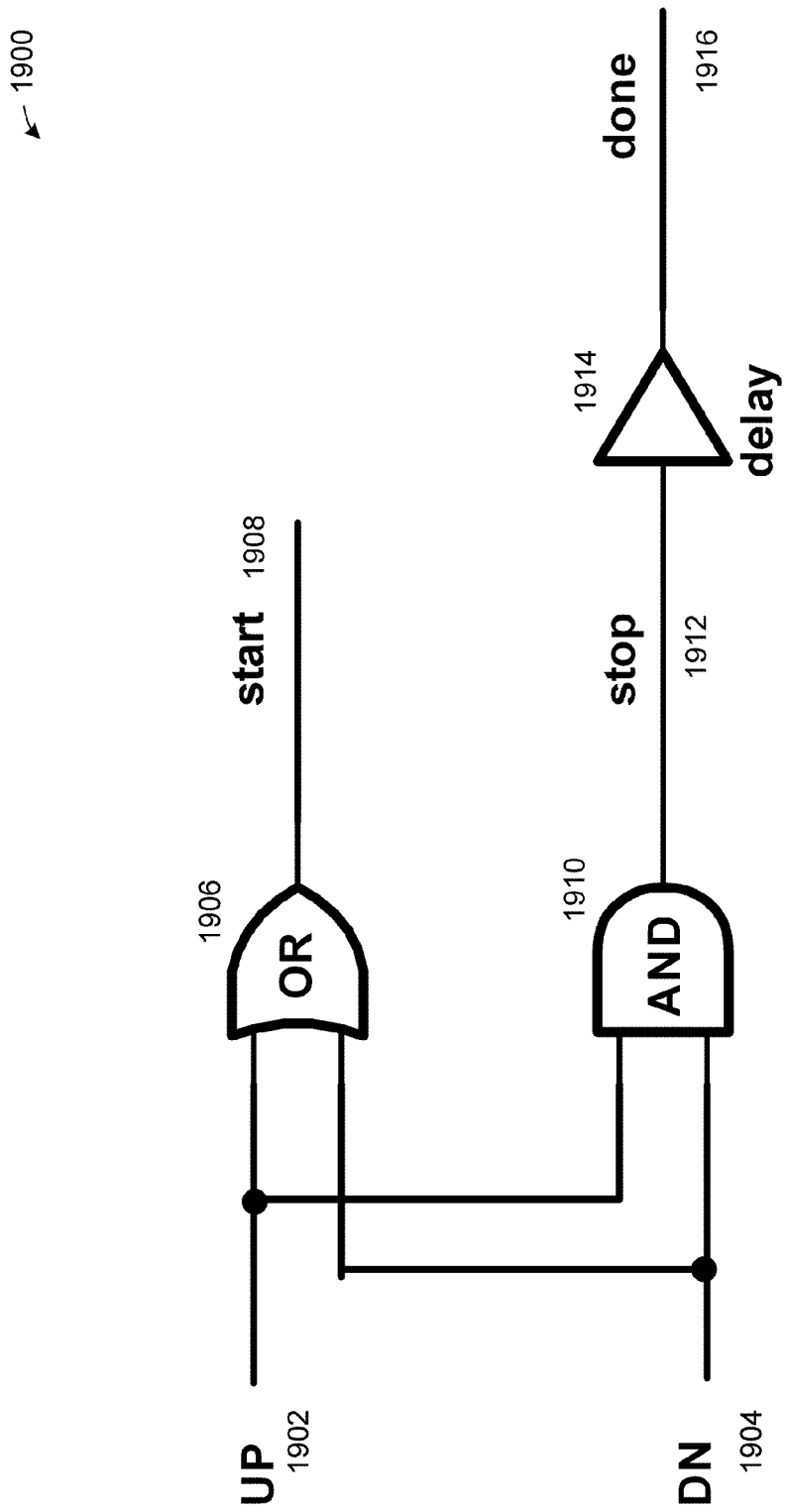
FIG. 19 illustrates an embodiment of the invention showing an example of start/stop logic.

FIG. 19 illustrates, generally at 1900, an embodiment of the invention showing an example of start/stop logic (Start/Stop logic). The start/stop logic generates various signals (start 1908, stop 1912, done 1916) to control the tdc (for example tdc 124 in FIG. 1). A "done" signal 1916 is delayed (via 1914 delay) of "stop" (stop) 1912 signal indicates the tdc has finished one UP/DN (1902/1904) phase measurement. 1906 is an OR gate, 1910 is an AND gate.

Figure 20:
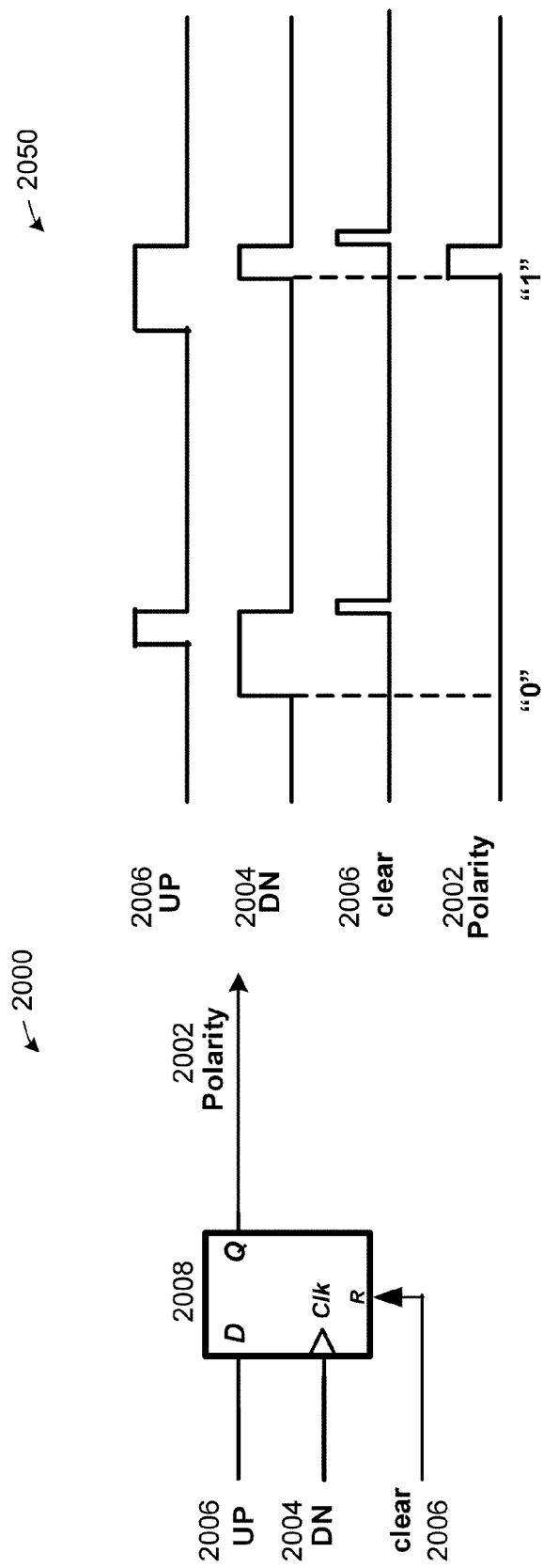
FIG. 20 illustrates embodiments of the invention showing an example of a Arbit logic implementation and operation timing.

FIG. 20 illustrates, generally at 2000 and 2050, embodiments of the invention showing an example of a Arbit logic implementation and operation timing (2000 and 2050 respectively). The polarity info (Polarity) 2002 is sent out at the rising edge of DN 2004 pulse generated by a PFD, and a "clear" pulse (clear) 2006 will reset the polarity info. At 2006 is an UP signal and at 2008 is a flip-flop.

Figure 21:
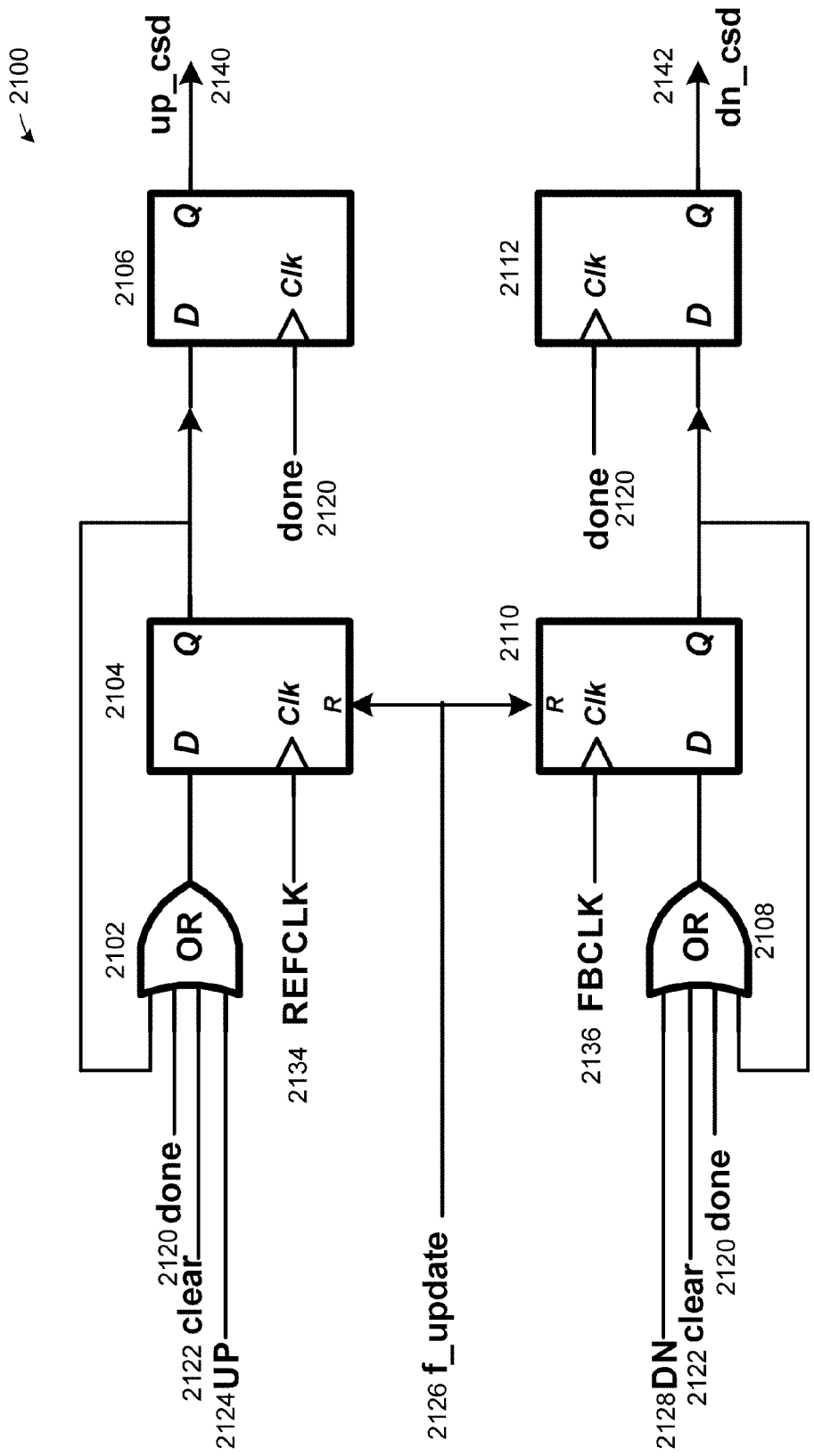
FIG. 21 illustrates an embodiment of the invention showing an example of a cycle slip detector.

FIG. 21 illustrates, generally at 2100, an embodiment of the invention showing an example of a cycle slip detector (Cycle slip detection). At 2102 is an OR gate. At 2104 is a D-type flip-flop. At 2106 is a D-type flip-flop. At 2108 is an OR gate. At 2110 is a D-type flip-flop. At 2112 is a D-type flip-flop. At 2120 is a done signal. At 2122 is a clear signal. At 2124 is an UP signal. At 2126 is an f_update signal. At 2128 is a DN (down) signal. At 2134 is a REFCLK signal. At 2136 is a FBCLK signal. At 2140 is an up-csd signal. At 2142 is a dn_csd signal.

Figure 22:
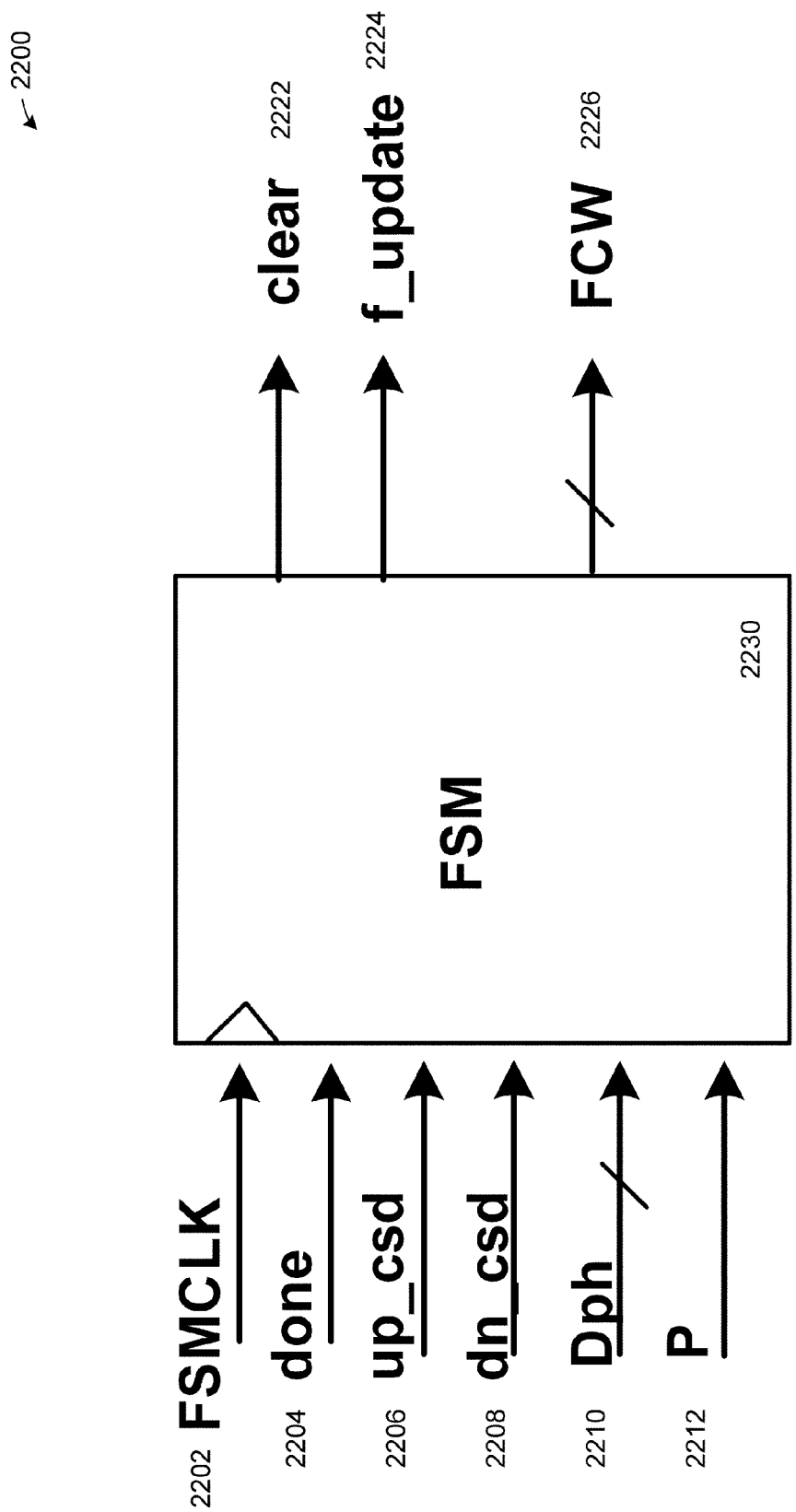
FIG. 22 illustrates an embodiment of the invention showing an example of a FSM (finite state machine).

FIG. 22 illustrates, generally at 2200, an embodiment of the invention showing an example of a FSM (finite state machine). At 2230 is FSM which receives input signals FSM-CLK 2202, done 2204, up_csd 2206, dn_csd 2208, Dph 2210, and P 2212, and which generates output signals clear 2222, f_update 2224, and FCW 2226.

The FSM will detect the signal "done" (done) 2204 all the time. When it detects that "done" (done) 2204 is logic high, it will sync all the input data from the TDC and start measurement cycles. It will generate a "clear" (clear) 2222 pulse every TDC phase measurement cycle, and an "_" (f_update) 2224 signal every two TDC phase measurement cycles, or every frequency measurement cycle. The frequency control word FCW 2226 will be updated every two TDC phase measurement cycles based on a binary search (or sometimes called successive approximation) technique.

FIG. 22 illustrates an embodiment in block level format of the transitory signals input and output to the apparatus FSM 2230. What is to be appreciated is that the FSM 2230 apparatus might utilize the FSM as shown in FIG. 15 to implement in hardware the functions shown in FIG. 4 combined with Table 1.

FIG. 23 illustrates, generally at 23, one embodiment of the invention showing a bank selection logic block. BSEL 2380 receives the bank select signal, which in this embodiment is shown as D0, D1, D2, and D3 (2310, 2311, 2312, 2313 respectively) which each respectively goes to transistors denoted 2340, 2350, 2360, and 2370 for switching on/off said transistor and selecting or not selecting pairs of capacitors respectively denoted 2342 and 2344, 2352 and 2354, 2362 and 2364, 2372 and 2374 to be active/inactive in the circuit. Inductor 2320 and capacitors 2322 and 2324 form an LC network across which BSEL 802 controls additional capacitances which can be in parallel with capacitors 2322 and 2324. Nodes 2302 and 2304 would connect to the LC oscillator circuit and BSEL 2380 now can select the banks of capacitors for frequency control. One of skill in the art will appreciate that there are other embodiments possible for a bank selection logic block.

Figure 24:
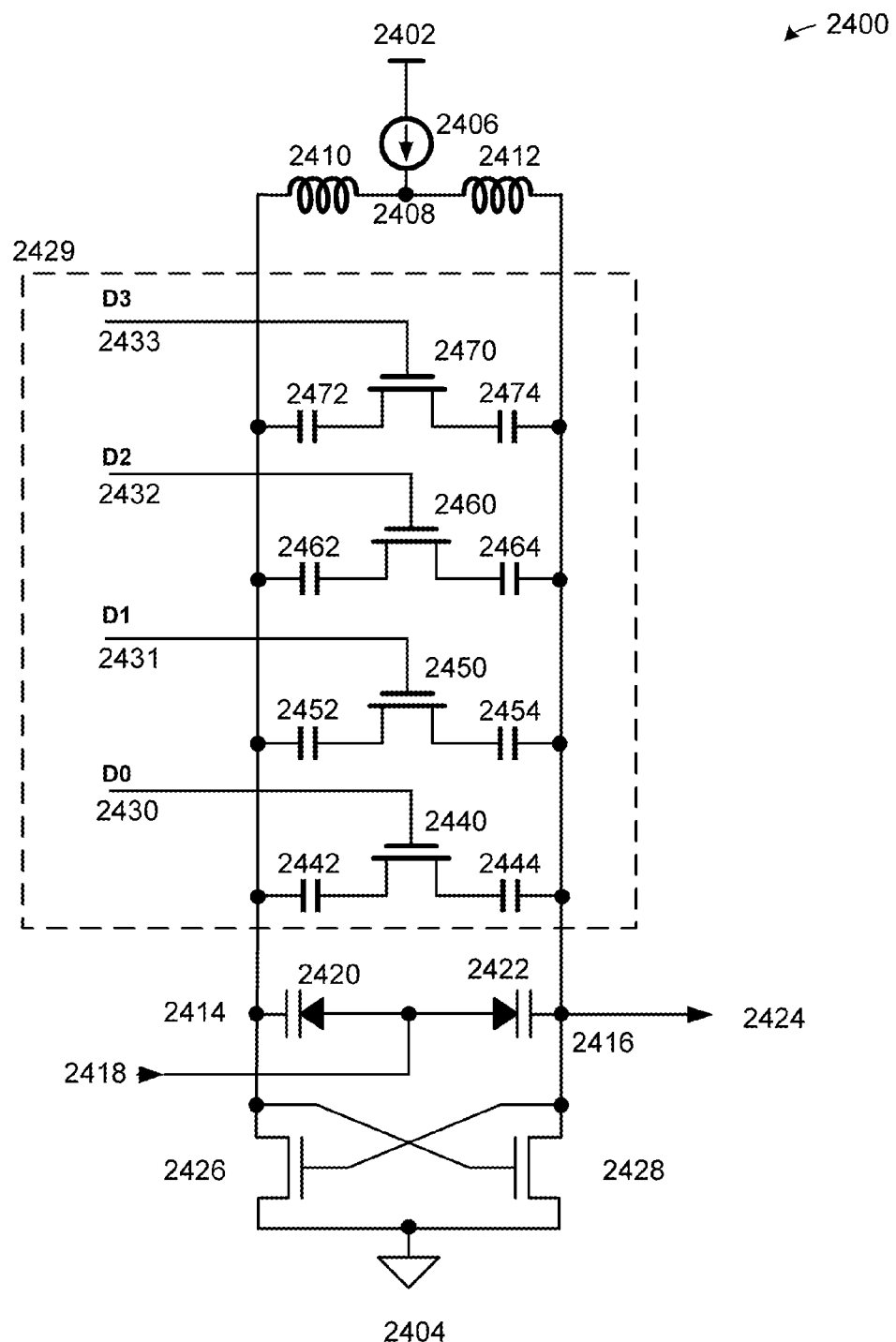
FIG. 24 illustrates, one embodiment of the invention showing a VCO band selection.

FIG. 24 illustrates, generally at 2400, one embodiment of the invention showing a VCO band selection. Transitory power is supplied at 2402 and 2404, for example, in the form of a positive and ground voltage respectively. At 2406 is a non-transitory hardware device that takes as input the transitory power 2402 and produces at 2408 a transitory signal in the form of a transitory constant current. At 2410 and 2412 are non-transitory devices in the form of inductors which take as input a transitory constant current 2408 and generate a transitory output current signal 2414 and 2416 respectively whose transitory current summation is equal to that of transitory constant current 2408. At 2418 is a transitory input voltage signal which goes to non-transitory hardware devices 2420 and 2422 both of which are in the form of a varactor diode. At 2424 is a transitory oscillating output signal. At 2426 and 2428 are non-transitory transistors that take as inputs the transitory output current signal 2414 and 2416 respectively and generate a transitory signal in the form of a transitory constant current equal in summation to that of transitory constant current 2408 plus any input current from transitory input voltage signal 2418 and minus any current from the transitory oscillating output signal 2424. In operation VCO 2400 is a tuned LC cross-coupled oscillator whose output frequency is adjusted by a voltage adjusting the C. Dashed box 2429 illustrates VCO band selection logic. By controlling D0, D1, D2, and D3 (2430, 2431, 2432, and 2433 respectively) respective capacitors pairs 2442 and 2444, 2452 and 2454, 2462 and 2464, 2472 and 2474 may be controlled by respective transistors 2440, 2450, 2460, and 2460 to add additional capacitance between nodes 2414 and 2416 thereby affecting the VCO LC network.

Thus a Method and Apparatus for Fast Frequency Acquisition in PLL System has been described.

Because of the high speed involved, embodiments of the present invention require specialized hardware.

As used in this description "FSM", "finite state machine" or similar phrases refers to specialized hardware that is not to be confused with a CPU (central processing unit). A FSM is specialized hardware that can perform in a dedicated fashion logic functions that are implemented in hardware.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

As used in this description, "substantially" or "substantially equal" or similar phrases are used to indicate that the items are very close or similar. Since two physical entities can never be exactly equal, a phrase such as "substantially equal" is used to indicate that they are for all practical purposes equal.

It is to be understood that in any one or more embodiments of the invention where alternative approaches or techniques are discussed that any and all such combinations as may be possible are hereby disclosed. For example, if there are five techniques discussed that are all possible, then denoting each technique as follows: A, B, C, D, E, each technique may be either present or not present with every other technique, thus yielding 2^5 or 32 combinations, in binary order ranging from not A and not B and not C and not D and not E to A and B and C and D and E. Applicant(s) hereby claims all such possible combinations. Applicant(s) hereby submit that the foregoing combinations comply with applicable EP (European Patent) standards. No preference is given any combination.

Thus a Method and Apparatus for Fast Frequency Acquisition in PLL System has been described.

What is claimed is:

1. A method for fast acquisition and lock of a phase locked loop comprising:
    using a time to digital converter to measure a phase difference between a feedback clock signal and a reference clock signal in said phase locked loop; and
    using a cycle slip detection logic to determine a relationship between said feedback clock signal and said reference clock signal in said PLL.

2. The method of claim 1 wherein said relationship is selected from the group consisting of faster, and not faster.

3. The method of claim 2 wherein said determine is done in one measurement cycle.

4. The method of claim 1 wherein said determine is done in one measurement cycle.

5. The method of claim 2 wherein said relationship determines an instant period difference (DT) as follows:
    denote as t1 a first time from when said feedback clock signal goes high before said reference clock signal goes high and said reference clock signal is low;
    denote as t3 a third time from when said feedback clock signal next goes high and said reference clock signal is low; and
    denote said DT as a DT00=t3−t1.

6. The method of claim 5 wherein said relationship further determines said instant period difference (DT) as follows:
    denote as t1 a first time from when said feedback clock signal goes high before said reference clock signal goes high and said reference clock signal is low;
    denote as t3 a third time from when said feedback clock signal next goes high and backwards when said reference clock signal is high; and
    denote said DT as a DT01=−(t1+t3).

7. The method of claim 6 wherein said relationship further determines said instant period difference (DT) as follows:
    denote as t1 a first time from when said reference clock signal goes high before said feedback clock signal goes high and said feedback clock signal is low;
    denote as t3 a third time from when said reference clock signal next goes high and backwards when said feedback clock signal is high; and
    denote said DT as a DT10=t1+t3.

8. The method of claim 7 wherein said relationship further determines said instant period difference (DT) as follows:
    denote as t1 a first time from when said reference clock signal goes high before said feedback clock signal goes high and said feedback clock signal is low;
    denote as t3 a third time from when said reference clock signal next goes high and when said feedback clock signal is low; and
    denote said DT as a DT11=t1−t3.

9. The method of claim 8 further comprising generating a polarity signal, said polarity signal having a value at a first time denoted P[n] and a second time denoted P[n+1] where n denotes an integer 1, 2, 3, . . . m, m denoting an arbitrarily high integer, and for
    said DT00: P[n]=0, P[n+1]=0;
    said DT01: P[n]=0, P[n+1]=1;
    said DT10: P[n]=1, P[n+1]=0; and
    said DT11: P[n]=1, P[n+1]=1.

10. An apparatus for generating a frequency control word signal comprising:
    a reference clock signal;
    a feedback clock signal;
    a phase frequency detector having a first input coupled to receive said reference clock signal, a second input coupled to receive said feedback clock signal, a third input for receiving a clear signal, and generating an up output signal and a down output signal;
    a first function block having a cycle slip detection unit, a start/stop logic unit, and an arbit logic unit, said first function block having a first input coupled to receive said up output signal, a second input coupled to receive said down output signal, a third input coupled to receive said reference clock signal, a fourth input coupled to receive said feedback clock signal, a fifth input coupled to receive said clear signal, and a sixth input coupled to receive an update signal, and generating a cycle slip detection up output signal, a cycle slip detection down output signal, a done signal, a phase output signal, and a polarity output signal; and
    a second function block having a finite state machine, said second function block having a first input coupled to receive said cycle slip detection up output signal, a second input coupled to receive said cycle slip detection down output signal, a third input coupled to receive said done signal, and a fourth input coupled to receive said phase output signal, and a fifth input coupled to receive said polarity output signal, and generating a clear signal, an update signal, and said frequency control word signal.

11. The apparatus of claim 10 wherein said start/stop logic unit generates said done signal, and a start and stop signal, and wherein said arbit logic generates a polarity signal.

12. The apparatus of claim 11 wherein said first function block further comprises a time to digital converter having a start input, a stop input, and a polarity input wherein said time to digital converter start input is coupled to receive said start/stop logic unit start signal, wherein said time to digital converter stop input is coupled to receive said start/stop logic unit stop signal, and wherein said time to digital converter polarity input is coupled to receive said arbit logic polarity signal, and wherein said time to digital converter generates said phase output signal and said polarity output signal.

13. The apparatus of claim 10 further comprising a bank selection logic block for a LC-VCO, said bank selection logic block having a bank select input coupled to receive said frequency control word signal.

14. The apparatus of claim 13 further comprising a digital to analog converter, said digital to analog converter having an input coupled to receive said frequency control word signal.

15. The apparatus of claim 14 further comprising a feedback clock divider, said feedback clock divider having an input coupled to receive said frequency control word signal.

16. The apparatus of claim 10 further comprising a digital to analog converter, said digital to analog converter having an input coupled to receive said frequency control word signal.

17. The apparatus of claim 10 further comprising a feedback clock divider, said feedback clock divider having an input coupled to receive said frequency control word signal.

18. The apparatus of claim 10 further comprising a digitally controlled oscillator, said digitally controlled oscillator having an input coupled to receive said frequency control word signal.

19. A method comprising in the ordered time segments explicitly listed below from (a) through (c):
   (a) resetting a phase frequency detector during time segment (a);
   (b) then performing three operations during time segment (b); performing a cycle slip detection using a reference clock signal and a feedback clock signal, performing a first time to digital converter measurement and performing a second time to digital converter measurement, and generating an output signal; and
   (c) then determining if said output signal has a cycle slip indication.

20. The method of claim 19 further comprising in the ordered time segments explicitly listed below from (d) through (i) after (c) in claim 19:
   (d) when said cycle slip indication is yes then proceeding to step (g);
   (e) calculating an instant period difference (DT) based on a time to digital converter phase difference and a polarity signal;
   (f) determining if an absolute value of said DT is less than a predetermined threshold value, and when yes proceeding to step (i);
   (g) adjusting a oscillator based on a frequency control word signal derived from a binary search;
   (h) determining if said frequency control word signal has reached a predetermined bit limit and when not proceeding to step (a); and
   (i) stopping.

* * * * *